United States Patent
Chun et al.

(10) Patent No.: US 9,941,285 B2
(45) Date of Patent: *Apr. 10, 2018

(54) PATTERN FORMING METHOD AND SEMICONDUCTOR DEVICE MANUFACTURING METHOD USING THE SAME

(71) Applicant: SK hynix Inc., Gyeonggi-do (KR)

(72) Inventors: Jae-Houb Chun, Gyeonggi-do (KR); Jeong-Sub Lim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/687,077

(22) Filed: Aug. 25, 2017

(65) Prior Publication Data
US 2017/0352667 A1    Dec. 7, 2017

Related U.S. Application Data

(63) Continuation of application No. 15/204,302, filed on Jul. 7, 2016, now Pat. No. 9,780,095.

(30) Foreign Application Priority Data

Feb. 22, 2016  (KR) .................. 10-2016-0020758

(51) Int. Cl.
*H01L 21/3205* (2006.01)
*H01L 27/108* (2006.01)

(52) U.S. Cl.
CPC .. *H01L 27/10885* (2013.01); *H01L 27/10897* (2013.01)

(58) Field of Classification Search
None
See application file for complete search history.

(56) References Cited

U.S. PATENT DOCUMENTS 9,379,133 B1 *  6/2016  Jung ................. H01L 27/11582
9,780,095 B2 * 10/2017  Chun et al. ....... H01L 27/10885

* cited by examiner

*Primary Examiner* — Bradley K Smith
(74) *Attorney, Agent, or Firm* — IP & T GROUP LLP

(57) ABSTRACT

A method for forming patterns includes forming an etch target layer; etching the etch target layer to form a pre-pattern having a line forming portion and a plurality of pad portions; forming a plurality of spacers which extend across the pad portions and the line forming portion; forming, over the spacers, a blocking layer having an opening which blocks the pad portions and exposes the line forming portion; and etching the line forming portion by using the blocking layer and the spacers as a barrier, to form a plurality of line portions.

13 Claims, 28 Drawing Sheets

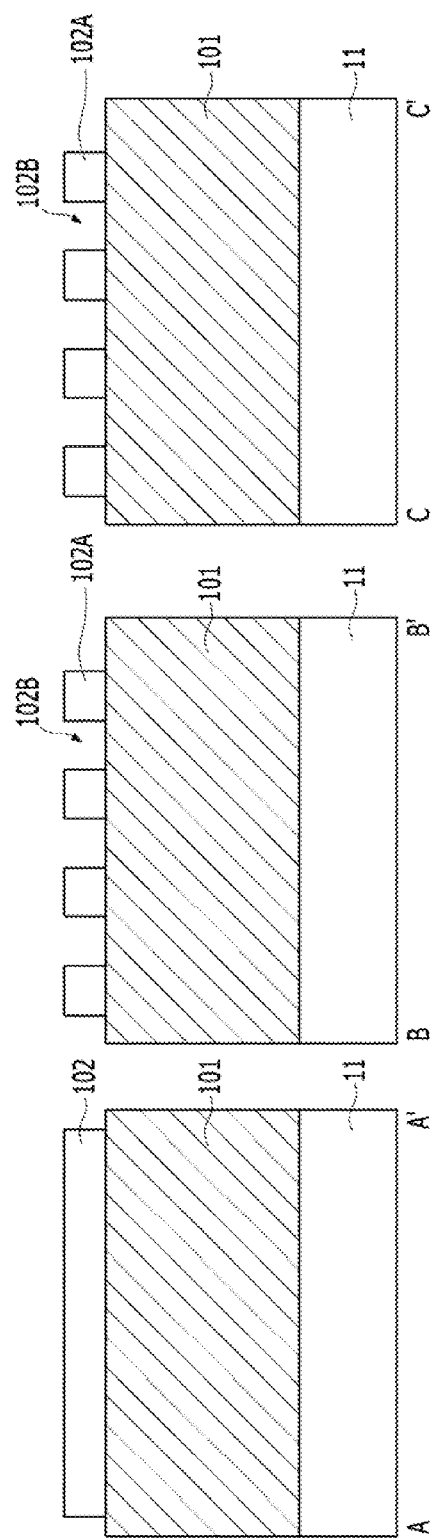

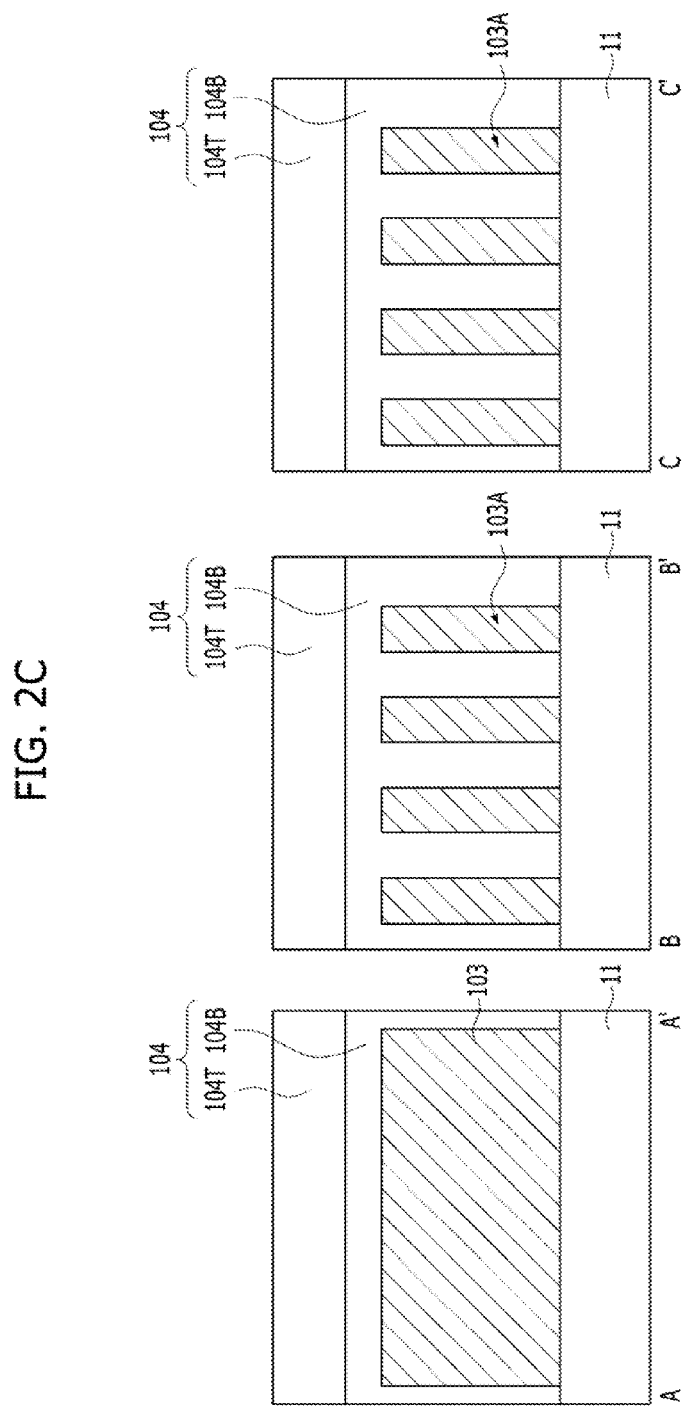

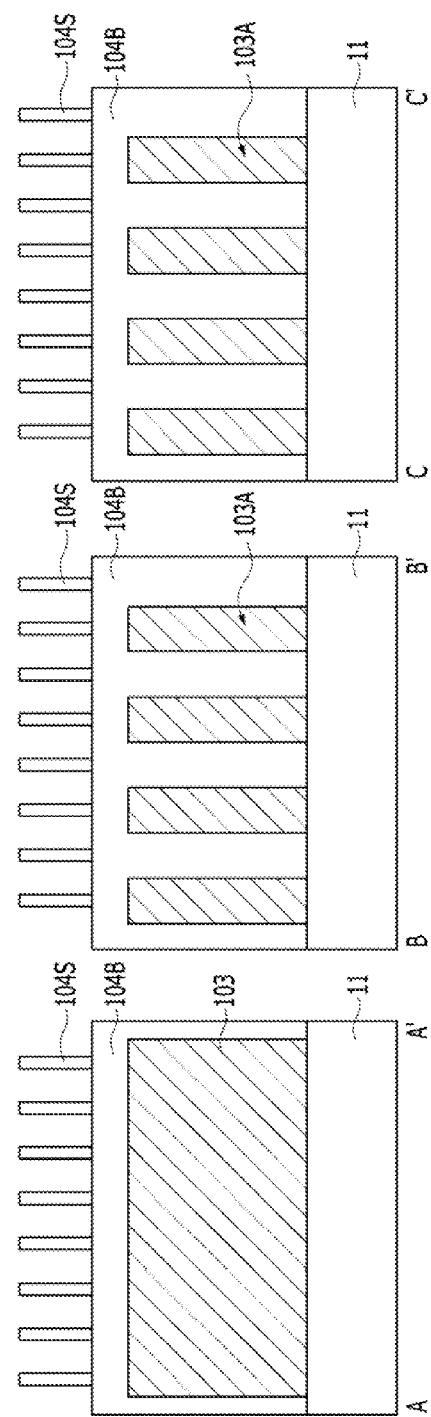

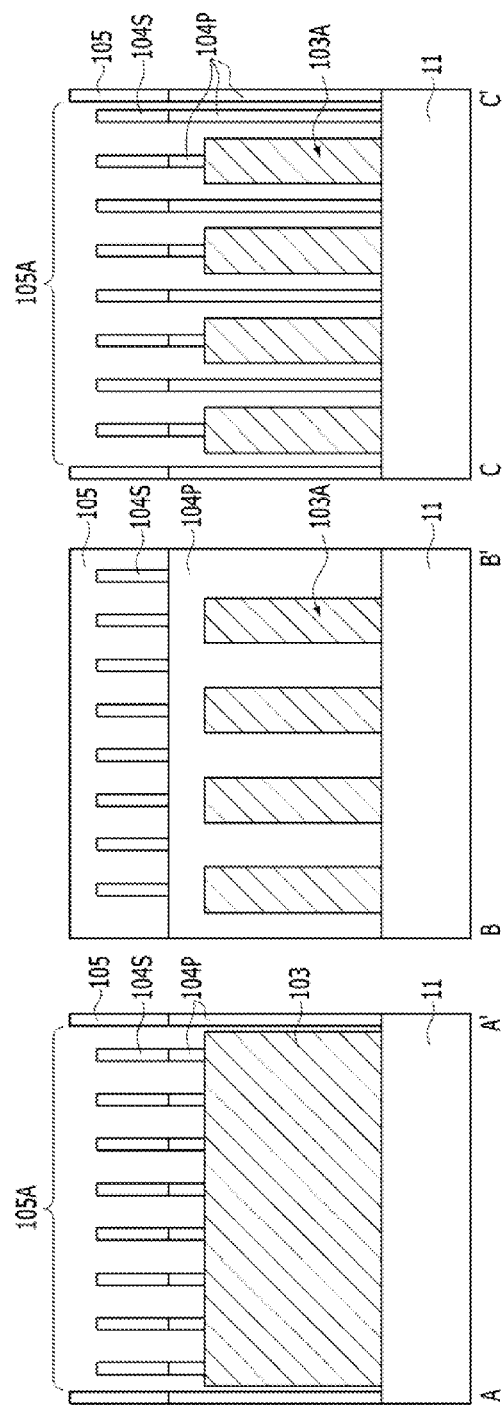

PATTERN FORMING METHOD AND SEMICONDUCTOR DEVICE MANUFACTURING METHOD USING THE SAME

CROSS-REFERENCE TO RELATED APPLICATION

This application is a continuation of U.S. patent application Ser. No. 15/204,302 filed on Jul. 7, 2016, which claims priority under 35 U.S.C. § 119 to Korean Patent Application No. 10-2016-0020758 filed on Feb. 22, 2016 with the Korean Intellectual Property Office. The disclosure of each of the foregoing applications is incorporated herein by reference in its entirety.

TECHNICAL FIELD

Exemplary embodiments of the present invention relate to a semiconductor device and, more particularly, to a pattern forming method and a semiconductor device manufacturing method using the same.

DISCUSSION OF THE RELATED ART

A plurality of patterns are formed in a process for manufacturing a semiconductor device. In a general photolithography process, there are limitations in minimizing a critical dimension of a pattern. Therefore, a technology for realizing a critical dimension capable of exceeding a critical resolution of the photolithography is needed.

SUMMARY

Various embodiments of the present invention are directed to a method for manufacturing a semiconductor device, capable of forming fine patterns.

In an embodiment, a method for forming patterns may include: forming an etch target layer; etching the etch target layer to form a pre-pattern having a line forming portion and a plurality of pad portions; forming a plurality of spacers which extend across the pad portions and the line forming portion; forming, over the spacers, a blocking layer having an opening which blocks the pad portions and exposes the line forming portion; and etching the line forming portion by using the blocking layer and the spacers as a barrier, to form a plurality of line portions. The pad portions may have shapes which protrude from the line forming portion. The pad portions protrude from both ends of the line forming portion in a first direction, and may be formed to be arranged in a zigzag style in a second direction crossing with the first direction. The line forming portion may have a plate shape. The pad portions and the line portions may be portions of bit lines. The spacers may have a line width smaller than the pad portions and the line forming portion. In the forming of the blocking layer, the opening of the blocking layer may be formed to have an area that exposes portions of the pad portions and the line forming portion. The forming of the spacers may include: forming a bottom layer over the pre-pattern; forming a top layer over the bottom layer; etching the top layer to form sacrificial patterns of line shapes over the bottom layer; forming the spacers on both sidewalls of the sacrificial patterns; and removing the sacrificial patterns. The etch target layer may include a metal.

In an embodiment, a method for manufacturing a semiconductor device may include: forming a bit line stack layer over a substrate; etching the bit line stack layer to form a pre-bit line pattern having a bit line forming portion and a plurality of bit line pad portions which protrude from the bit line forming portion; forming a hard mask layer including a plurality of spacers which extend across the bit line pad portions and the bit line forming portion; forming, over the hard mask layer, a blocking layer having an opening which blocks the bit line pad portions and exposes the bit line forming portion; etching the bit line forming portion by using the blocking layer and the hard mask layer as a barrier, to form a plurality of bit line portions; and forming contact plugs which may be connected to the bit line pad portions. The bit line pad portions may have shapes which protrude from the bit line forming portion. The bit line pad portions protrude from both ends of the bit line forming portion in a first direction, and may be formed to be arranged in a zigzag style in a second direction crossing with the first direction. The bit line forming portion may have a plate shape. The spacers may have a line width smaller than the bit line pad portions and the bit line forming portion. In the forming of the blocking layer, the opening of the blocking layer may be formed to have an area that exposes portions of the bit line pad portions and the bit line forming portion. The forming of the spacers may include: forming a bottom layer over the pre-bit line pattern; forming a top layer over the bottom layer; etching the top layer to form sacrificial patterns of line shapes over the bottom layer; forming the spacers on both sidewalls of the sacrificial patterns; and removing the sacrificial patterns.

In an embodiment, a method for manufacturing a semiconductor device may include: forming a stack layer over a substrate including a cell region and a peripheral circuit region; etching a portion of the stack layer to form a gate structure in the peripheral circuit region; etching a remaining portion of the stack layer to form a pre-bit line pattern having a bit line forming portion and a plurality of bit line pad portions which protrude from the bit line forming portion, in the cell region; forming a hard mask layer including a plurality of spacers which extend across the bit line pad portions and the bit line forming portion; forming, over the hard mask layer, a blocking layer having an opening which blocks the bit line pad portions and exposes the bit line forming portion; etching the bit line forming portion by using the blocking layer and the hard mask layer as a barrier, to form a plurality of bit line portions; and forming contact plugs which may be connected to the bit line pad portions. The forming of the gate structure and the forming of the pre-bit line pattern may be performed using a gate mask layer for forming the gate structure and an etch mask layer for forming the pre-bit line pattern. The gate mask layer and the etch mask layer may be formed by performing a photolithography process one time. The bit line pad portions protrude from both ends of the bit line forming portion in a first direction, and may be formed to be arranged in a zigzag style in a second direction crossing with the first direction. The bit line forming portion may have a plate shape. The spacers may have a line width smaller than the bit line pad portions and the bit line forming portion. In the forming of the blocking layer, the opening of the blocking layer may be formed to have an area that exposes portions of the bit line pad portions and the bit line forming portion. The forming of the spacers may include: forming a bottom layer over the pre-bit line pattern; forming a top layer over the bottom layer; etching the top layer to form sacrificial patterns of line shapes over the bottom layer; forming the spacers on both sidewalls of the sacrificial patterns; and removing the sacrificial patterns.

In an embodiment, a method for forming patterns may include: forming an etch target layer; etching the etch target layer to form a pre-pattern having pad portions and a line forming portion; and etching the line forming portion of the pre-pattern to form line portions. The forming of the line portions may include: forming spacers which extend across the pad portions and the line forming portion; forming, over the spacers, a blocking layer which blocks the pad portions and opens the line forming portion; and etching the line forming portion by using the blocking layer as a barrier. The forming of the spacers may include: forming sacrificial patterns of line shapes over the pre-pattern; forming the spacers on sidewalls of the sacrificial patterns; and removing the sacrificial patterns. The spacers may have a line width smaller than the pad portions and the line forming portion. The pad portions may have shapes which protrude from the line forming portion. The line forming portion may have a plate shape.

In an embodiment, a method for forming patterns may include: forming an etch target layer; etching the etch target layer to form a pre-pattern of a plate shape; forming a plurality of spacers over the pre-pattern; forming a blocking layer having a base portion which covers end portions of the spacers, pad-like portions which protrude from the base portion and an opening which exposes the other portions of the spacers and the pre-pattern; and etching the pre-pattern by using the blocking layer and the spacers as a barrier, to form a plurality of line portions and a plurality of pad portions. In the forming of the blocking layer, the pad-like portions protrude from the base portion in a first direction, and may be formed to be arranged in a zigzag style in a second direction crossing with the first direction. The pad portions and the line portions may be portions of bit lines. The spacers may have a line width smaller than the pad-like portions. The forming of the spacers may include: forming a bottom layer over the pre-pattern; forming a top layer over the bottom layer; etching the top layer to form sacrificial patterns of line shapes over the bottom layer; forming the spacers on both sidewalls of the sacrificial patterns; and removing the sacrificial patterns.

In an embodiment, a method for manufacturing a semiconductor device may include: forming a bit line stack layer over a substrate; etching the bit line stack layer to form a pre-bit line pattern of a plate shape; forming a hard mask layer including a plurality of spacers, over the pre-bit line pattern; forming a blocking layer having a base portion which covers end portions of the spacers, pad-like portions which protrude from the base portion and an opening which exposes the other portions of the spacers and the pre-bit line pattern; etching the pre-bit line pattern by using the blocking layer and the spacers as a barrier, to form a plurality of bit line portions and a plurality of bit line pad portions; and forming contact plugs which may be connected to the bit line pad portions. In the forming of the blocking layer, the pad-like portions protrude from the base portion in a first direction, and may be formed to be arranged in a zigzag style in a second direction crossing with the first direction. The spacers may have a line width smaller than the pad-like portions. The forming of the spacers may include: forming a bottom layer over the pre-bit line pattern; forming a top layer over the bottom layer; etching the top layer to form sacrificial patterns of line shapes over the bottom layer; forming the spacers on both sidewalls of the sacrificial patterns; and removing the sacrificial patterns.

In an embodiment, a method for manufacturing a semiconductor device may include: forming a stack layer over a substrate including a cell region and a peripheral circuit region; etching a portion of the stack layer to form a gate structure in the peripheral circuit region; etching a remaining portion of the stack layer to form a pre-bit line pattern of a plate shape in the cell region; forming a hard mask layer including a plurality of spacers, over the pre-bit line pattern; forming a blocking layer having a base portion which covers end portions of the spacers, pad-like portions which protrude from the base portion and an opening which exposes the other portions of the spacers and the pre-bit line pattern; etching the pre-bit line pattern by using the blocking layer and the spacers as a barrier, to form a plurality of bit line portions and a plurality of bit line pad portions; and forming contact plugs which may be connected to the bit line pad portions. In the forming of the blocking layer, the pad-like portions protrude from the base portion in a first direction, and may be formed to be arranged in a zigzag style in a second direction crossing with the first direction. The spacers may have a line width smaller than the pad-like portions. The forming of the spacers may include: forming a bottom layer over the pre-bit line pattern; forming a top layer over the bottom layer; etching the top layer to form sacrificial patterns of line shapes over the bottom layer; forming the spacers on both sidewalls of the sacrificial patterns; and removing the sacrificial patterns.

BRIEF DESCRIPTION OF THE DRAWINGS

FIGS. 2A to 2I are side, cross-sectional views taken along lines A-A', B-B' and C-C' of FIGS. 1A to 1I.

DETAILED DESCRIPTION

Figure 1A:
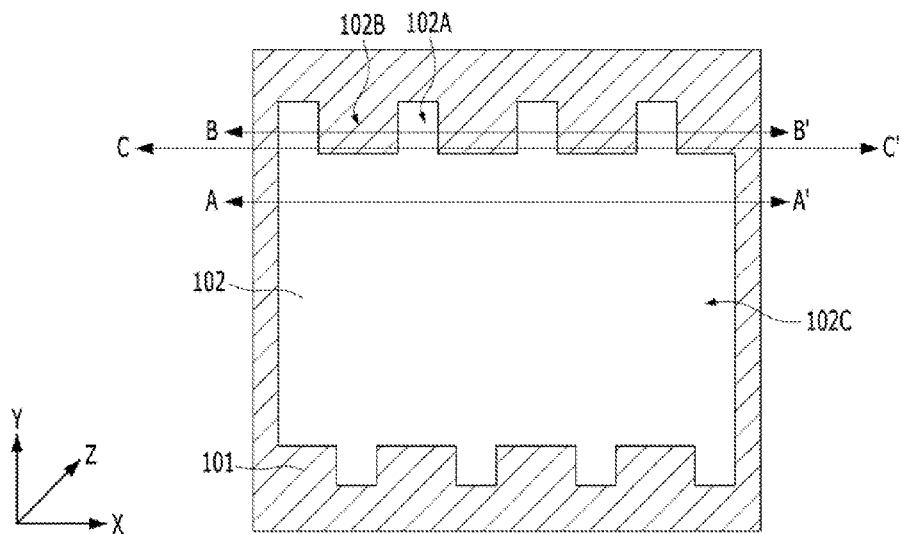
FIGS. 1A to 1I are schematic plan views of a semiconductor device illustrating a method for forming patterns of the semiconductor device, according to a first embodiment of the present invention.

Various embodiments of the present invention will be described below in more detail with reference to the accompanying drawings. The present invention may, however, be embodied in different forms and should not be construed as being limited to the embodiments set forth herein. Rather, these embodiments are provided so that this disclosure will be thorough and complete. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

First, for understanding the present invention, a conventional method for manufacturing a fine pattern of a semiconductor device will be described. Specifically, for making a fine pattern which exceeds the critical resolution of photolithography processes, a double patterning technology (DPT) has been developed. An example of the double patterning technology, is known in the art as a spacer patterning technology (SPT). According to the SPT after forming sacrificial patterns, spacers are formed on both sidewalls of the sacrificial patterns. Thereafter, the sacrificial patterns are removed, and the remaining spacers are used as an etch mask. The spacer patterning technology has been employed suitable for forming repetitive fine patterns spaced apart along a semiconductor surface at a regular interval.

In a semiconductor device, such as a DRAM (dynamic random access memory), a multi-layered wiring structure may be adopted, and contact plugs may be used to connect multi-layered wiring lines. The contact plugs may be manufactured by forming contact holes in a dielectric layer and filling the contact holes with a conductive layer.

If the contact holes are misaligned with the wiring lines, a material lying under the wiring lines may be etched. This is referred to as a punch effect. Because of the punch effect, the underlying material may be exposed and thus, the contact plugs formed in the contact holes may be electrically connected, not only, to the wiring lines but also to the underlying material. The underlying material may be, for example, a substrate. As a result, leakage may occur between the contact plugs and the substrate.

According to an embodiment of the present invention, a wiring line, for example, a pattern may be formed to include a line portion and a pad portion. The pad portion may be connected to an end of the line portion. The pad portion of the pattern may be larger in width, i.e., have a larger cross-section, than the line portion of the pattern. Moreover, by forming the pad portion at a position where a contact hole is to be formed as will be explained more in detail below in reference to the drawings, punching of the underlying material may be prevented when forming the contact hole.

Referring now to FIGS. 1A to 1I and FIGS. 2A to 2I a method for forming a pattern of a semiconductor device is provided, according to a first embodiment of the present invention. FIGS. 2A to 2I are cross-sectional views taken along the lines A-A', B-B' and C-C' of FIGS. 1A to 1I which are plan views.

As shown in FIGS. 1A and 2A, an etch target layer 101 may be formed on a substrate 11. The substrate 11 may be a single layer or a multi-layer. The substrate 11 may be or include a dielectric layer, a conductive layer, a semiconductor layer or a combination thereof. The substrate 11 may include a semiconductor substrate. For example, the substrate 11 may include a silicon substrate, a silicon-germanium substrate, or a Silicon On Insulator (SOI) substrate. The substrate 11 may include a shallow trench isolation (STI) region. For example, the substrate 11 may include a silicon substrate in which a shallow trench isolation (STI) region is formed.

The etch target layer 101 may be a single layer. The etch target layer 101 may be a multi-layer. For example, the etch target layer 101 may be or include a dielectric layer, a conductive layer, a semiconductor layer or a combination thereof. The etch target layer 101 may include a metal layer. In an embodiment, the etch target layer 101 may be a stack of a metal layer and a dielectric layer. In another embodiment, the etch target layer 101 may be a material suitable for forming bit line structures. For example, the etch target layer 101 may be a multilayer, including a barrier layer, a bit line layer and a hard mask layer stacked sequentially in this order with the barrier layer being on top of the substrate 11. The barrier layer may, for example, be or include tungsten nitride (WN), titanium nitride (TiN), tungsten silicon nitride (WSiN) or a combination thereof. The bit line layer may be or include a metal layer. The bit line layer may be or include a tungsten layer. The hard mask layer may be or include a nitride, an oxide, a carbon, a polysilicon, an SOC (spin-on-carbon) or a combination thereof.

An etch mask layer 102 may be formed on the etch target layer 101. The etch mask layer 102 may be or include a photoresist. In another embodiment, the etch mask layer 102 may be a material which has an etching selectivity with respect to the etch target layer 101. The etch mask layer 102 may be or include a nitride, an oxide, a carbon, an ARC (anti-reflection coating), a polysilicon, an SOC or a combination thereof. The etch mask layer 102 may be a multi-layer which is made up of different materials. The etch mask layer 102 may include a plurality of first portions 102A and a plurality of second portions 102B. Because of the spacings between neighboring first portions 102A provided by the second portions 102B, portions of the etch target layer 101 may be exposed. The exposed portions of the etch target layer 101 may be non-pad portions. The non-exposed portions of the etch target layer 101 which are covered by the first portions 102A of the etch mask layer 102 may be regions where pad portions are to be formed. The respective first portions 102A of the etch mask layer 102 may have the same size. The respective second portions 102B of the etch mask layer 102 may have the same size. The first portions 102A and the second portions 102B of the etch mask layer 102 may be alternately and repetitively formed. The first portions 102A and the second portions 102B of the etch mask layer 102 may be successive to each other. The first portions 102A and the second portions 102B of the etch mask layer 102 may have quadrangular shapes which extend in opposite directions, when viewed from the top. For example, the first portions 102A may be convex, and the second portions 102B may be concave. The etch mask layer 102 may further include a third portion 102C. The third portion 102C may have a plate shape and may be larger in area than the first portions 102A and the second portions 102B. Most of the etch target layer 101 may be covered by the third portion 102C. The first portions 102A and the second portions 102B may be connected to the ends of the third portion 102C. The first portions 102A of the etch mask layer 102 may protrude from the third portion 102C in a first direction Y. When viewed in the first direction Y, the first portions 102A may protrude from both ends of the third portion 102C. The first portions 102A protruded from one end of the third portion 102C may not be formed on the same straight lines as the first portions 102A protruded from the other end of the third portion 102C. Accordingly, the first portions 102A protruded from one end of the third portion 102C and the first portions 102A protruded from the other end of the third portion 102C may be alternately formed along a second direction X. That is to say, the first portions 102A may be arranged in a zigzag style along the second direction X. In the same manner as the first portions 102A, the second portions 102B adjacent to one end of the third portion 102C may not be formed on the same straight lines as the second portions 102B adjacent to the other end of the third portion 102C along the first direction Y. For example, the second portions 102B adjacent to one end of the third portion 102C and the second portions 102B adjacent to the other end of the third portion 102C may be arranged in a zigzag style along the second direction X.

Figure 1B:
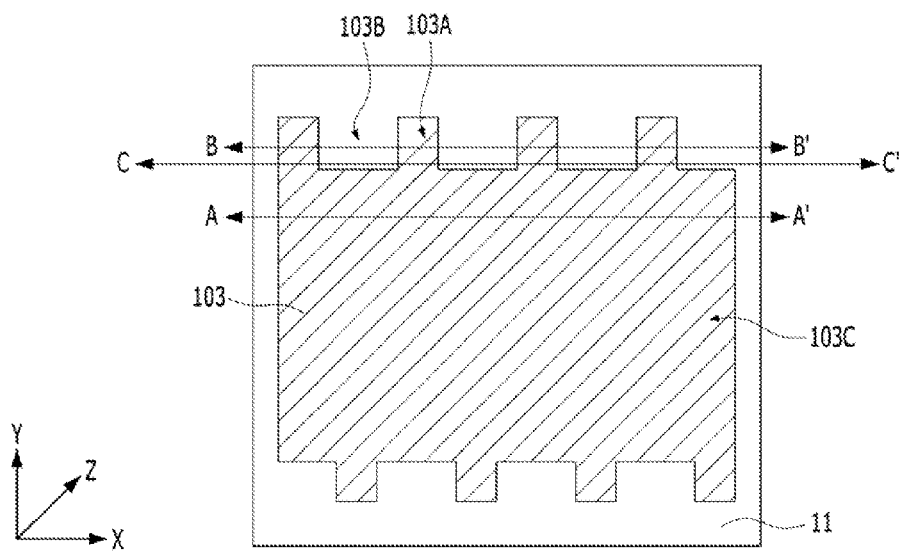
Figure 2B:
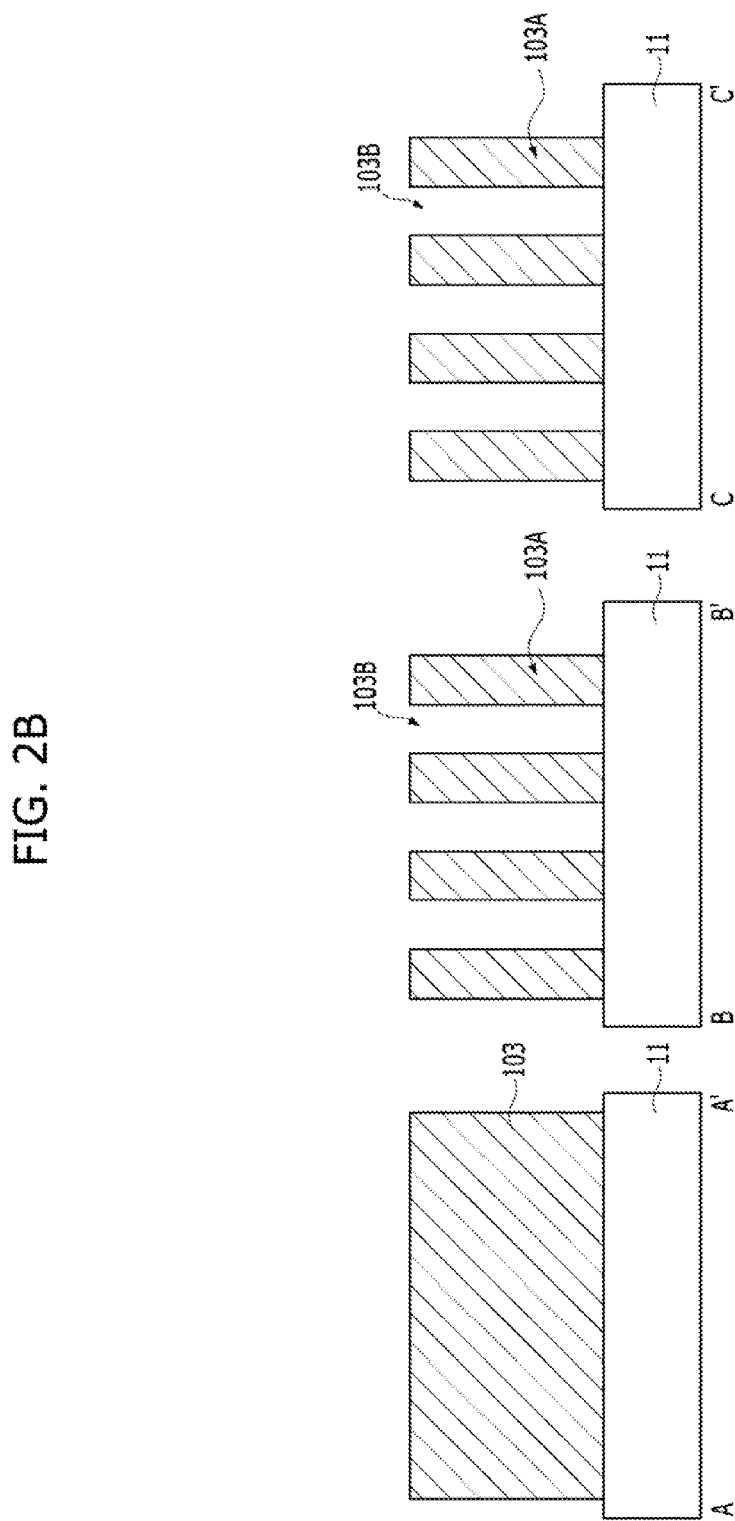

As shown in FIGS. 1B and 2B, a pre-pattern 103 may be formed. In order to form the pre-pattern 103, the etch target layer 101 may be etched using the etch mask layer 102. The pre-pattern 103 may include first portions 103A and second portions 103B. The first portions 103A of the pre-pattern 103 may be the same shapes as the first portions 102A of the etch mask layer 102. The second portions 103B of the pre-pattern 103 may be the same shapes as the second portions 102B of the etch mask layer 102. The pre-pattern 103 may further include a third portion 103C having the same shape as the third portion 102C of the etch mask layer 102.

Because of the spacings between neighboring first portions 103A, that is, because of the second portions 103B, portions of the substrate 11 may be exposed. The first portions 103A of the pre-pattern 103 may be regions corresponding to the pad portions. For example, the first portions 103A of the pre-pattern 103 may become pad portions 106P of FIG. 1I. The second portions 103B of the pre-pattern 103 may become the spacings between the pad portions. The first portions 103A may all have the same size. Also, all the second portions 103B may have the same size. The first portions 103A and the second portions 103B may be alternately and repetitively formed. The first portions 103A and the second portions 103B may be successive to each other. The first portions 103A and the second portions 103B may have quadrangular shapes which extend in opposite directions, when viewed from the top. For example, the first portions 103A may be convex, and the second portions 103B may be concave. The third portion 103C of the pre-pattern 103 may be a large rectangular, flat area, larger than the first portions 103A and the second portions 103B. Most of the substrate 11 may be covered by the third portion 103C. The first portions 103A and the second portions 103B may be connected to the ends of the third portion 103C. When viewed in the first direction Y, the first portions 103A may protrude from both ends of the third portion 103C. The first portions 103A protruded from one end of the third portion 103C may not be formed on the same straight lines as the first portions 103A protruded from the other end of the third portion 103C. Accordingly, the first portions 103A protruded from one end of the third portion 103C and the first portions 103A protruded from the other end of the third portion 103C may be alternately formed along the second direction X. That is to say, the first portions 103A may be arranged in a zigzag style along the second direction X. In the same manner as the first portions 103A, the second portions 103B adjacent to one end of the third portion 103C may not be formed on the same straight lines as the second portions 102B adjacent to the other end of the third portion 103C along the first direction Y. For example, the first portions 103A protruded from one end of the third portion 103C and the first portions 103A protruded from the other end of the third portion 103C may be arranged in a zigzag style along the second direction X.

The third portion 103C of the pre-pattern 103 may be a portion where line portions are to be formed. The third portion 103C may be referred to as a line forming portion. In a case where the present embodiment is applied to a method for forming bit line structures, the third portion 103C may be referred to as a bit line forming portion. Therefore, bit line pad portions may be formed in advance when forming a pre-pattern, and bit line portions may be formed in a subsequent process.

Next, the etch mask layer 102 may be removed.

As described above, the pre-pattern 103 may be formed by a single masking and etching process. Also, when forming the pre-pattern 103, the first portions 103A corresponding to the pad portions may be formed in advance. As will be described later, the line portions may be formed using an SPT process and a blocking layer.

Figure 1C:
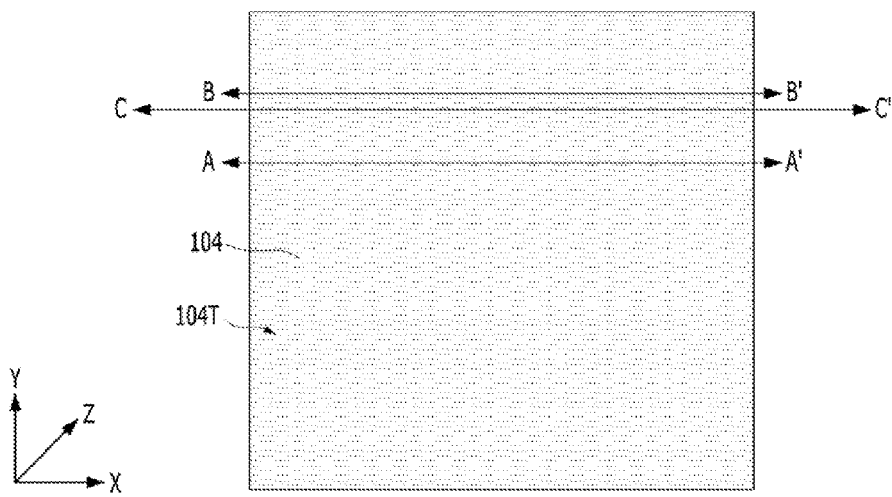

As shown in FIGS. 1C and 2C, a hard mask layer 104 may be formed. The hard mask layer 104 may be any suitable material which has an etching selectivity with respect to the pre-pattern 103. The hard mask layer 104 may be or include, for example, a nitride, an oxide, a carbon, a polysilicon, an SOC or a combination thereof. The hard mask layer 104 may be a multi-layer which is made up of different materials. The hard mask layer 104 may include a bottom layer 104B and a top layer 104T. The bottom layer 104B may fill the second portions 103B of the pre-pattern 103 and cover the first portions 103A of the pre-pattern 103. The top layer 104T may be formed on the bottom layer 104B. The bottom layer 104B and the top layer 104T may be different materials. The top layer 104T may be any suitable material which has an etching selectivity with respect to the bottom layer 104B.

Subsequently, as shown in FIGS. 1D, 1E, 2D and 2E, an SPT (spacer patterning technology) process may be performed.

Figure 1D:
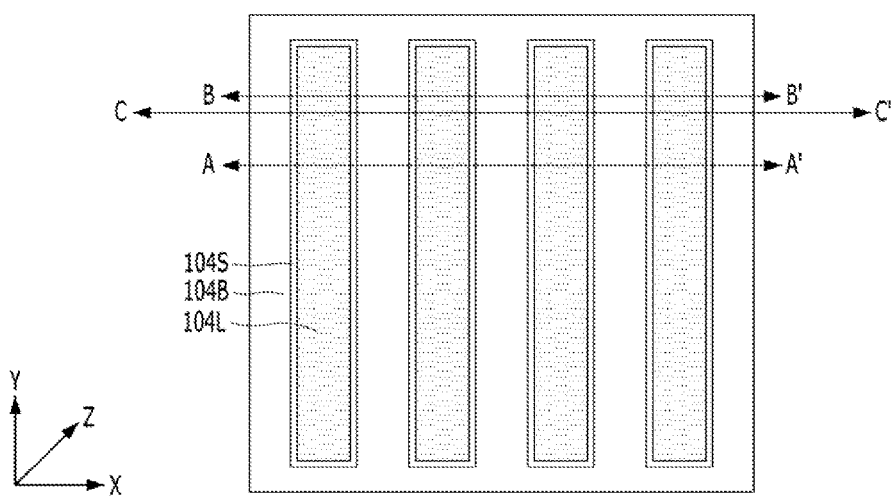
Figure 2D:
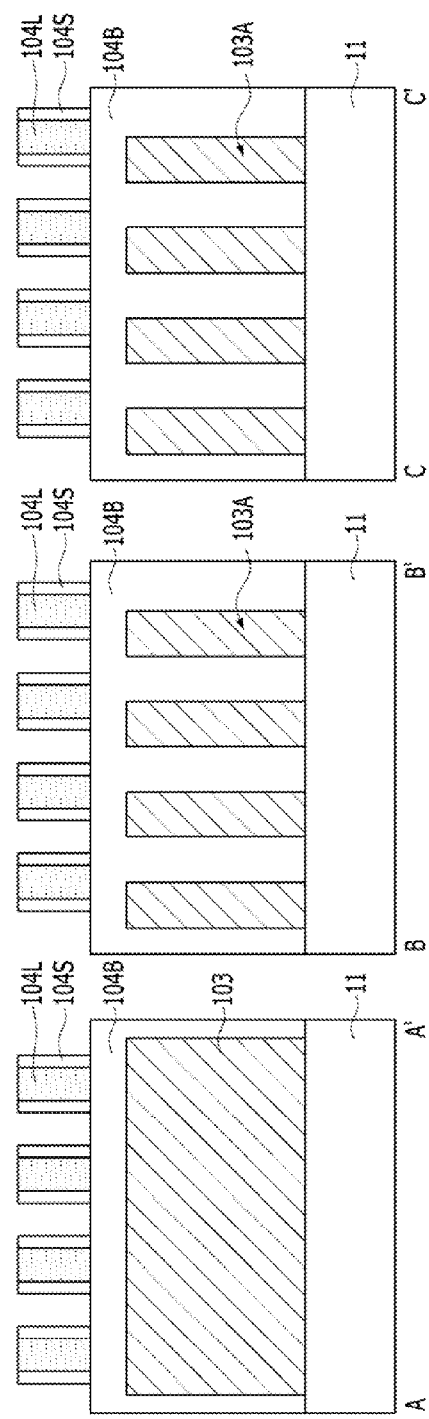

As shown in FIGS. 1D and 2D, a plurality of sacrificial patterns 104L may be formed. The plurality of sacrificial patterns 104L may be formed by etching the top layer 104T of the hard mask layer 104. The plurality of sacrificial patterns 104L may be line shapes. Portions of the bottom layer 104B may be exposed between the sacrificial patterns 104L. The sacrificial patterns 104L may extend in the first direction Y.

Next, a plurality of spacers 104S may be formed. The spacers 104S may be formed on the sidewalls of the sacrificial patterns 104L. The spacers 104S may include a material which has an etching selectivity with respect to the bottom layer 104B and the sacrificial patterns 104L. For example, in order to form the spacers 104S, an oxide layer may be formed on the sacrificial patterns 104L and the bottom layer 104B. Then, the oxide layer may be etched back, so that the spacers 104S may be formed on both sidewalls of the sacrificial patterns 104L. The spacers 104S may be shapes extending across the first portions 103A and the third portion 103C of the pre-pattern 103. Portions of the spacers 104S may be shapes extending across the second portions 103B and the third portion 103C of the pre-pattern 103.

Figure 1E:
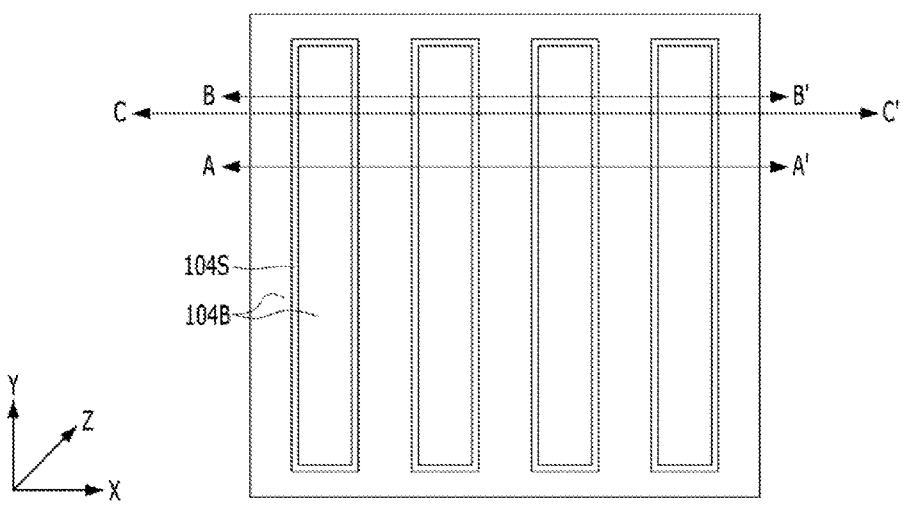

As shown in FIGS. 1E and 2E, the sacrificial patterns 104L may be removed so that the insides of the spacers 104S may be opened. Only the spacers 104S may remain on the bottom layer 104B. The spacers 104S may be closed-loop shapes.

Figure 1F:
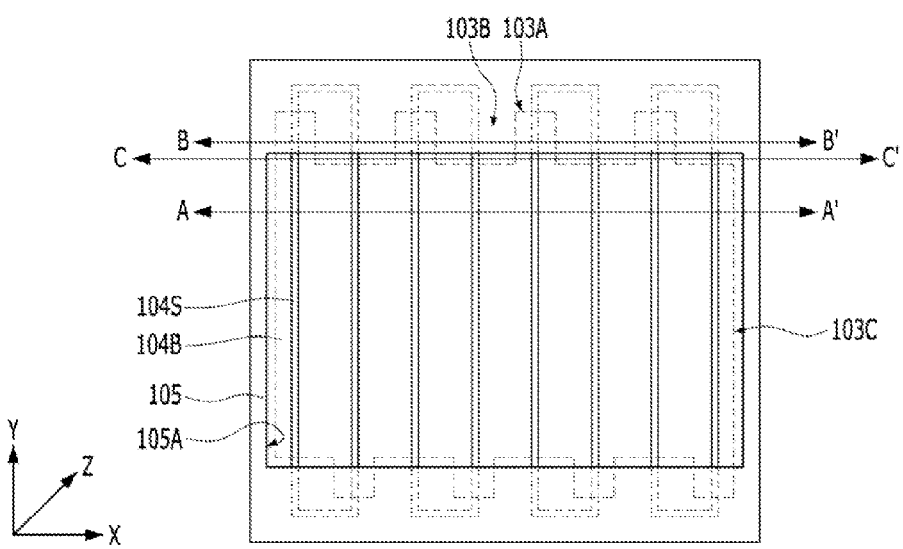
Figure 2F:
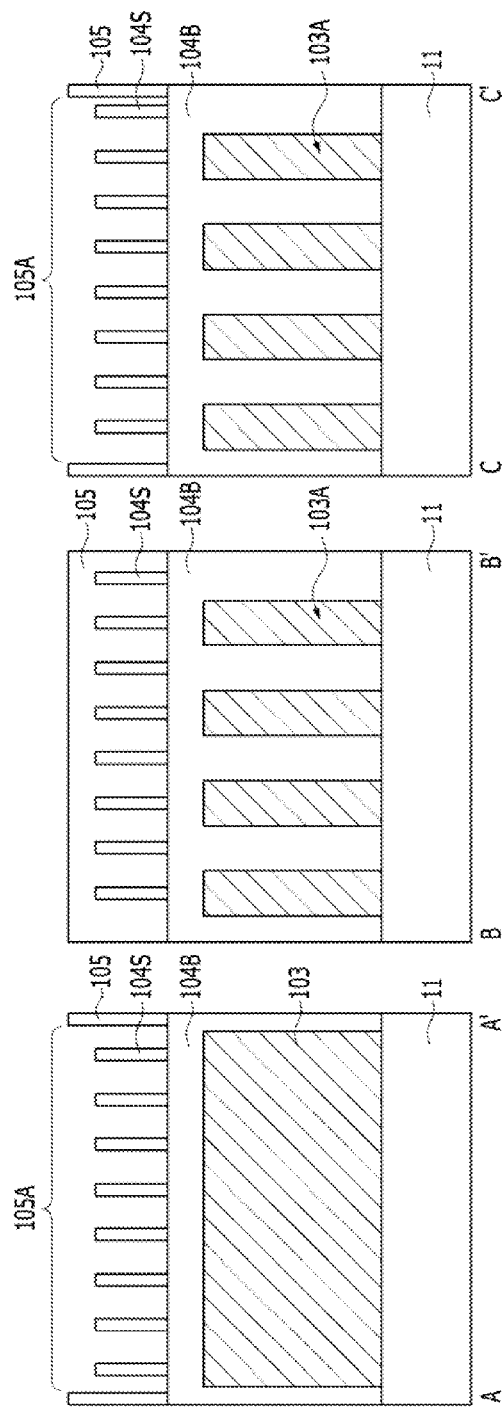

As shown in FIGS. 1F and 2F, a blocking layer 105 may be formed. The blocking layer 105 may include an opening 105A. The opening 105A of the blocking layer 105 may have an area larger than the third portion 103C of the pre-pattern 103. For example, the opening 105A may have an area that exposes portions of the first portions 103A and the second portions 103B of the pre-pattern 103. Portions exposed by the opening 105A of the blocking layer 105 may be larger in area than non-exposed portions. In this way, by adjusting the area of the opening 105A, the size of the pad portions to be formed by etching the first portions 103A may be changed. In another embodiment, the opening 105A of the blocking layer 105 may have an area corresponding to the third portion 103C of the pre-pattern 103.

Because of the opening 105A of the blocking layer 105, portions of the spacers 104S and the bottom layer 104B are exposed.

In another embodiment, when viewed in the second direction X, the opening 105A of the blocking layer 105 may be aligned with the edges of the third portion 103C of the pre-pattern 103.

Figure 1G:
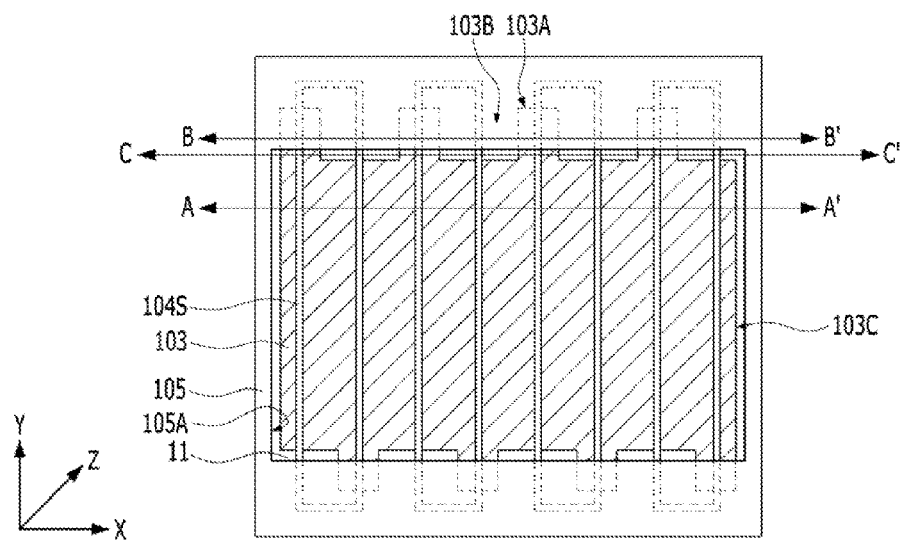

As shown in FIGS. 1G and 2G, the bottom layer 104B may be etched using the blocking layer 105 and the spacers 104S. After the bottom layer 104B is etched, portions of the pre-pattern 103 may be exposed. The bottom layer 104B may remain as a patterned bottom layer 104P.

Figure 1H:
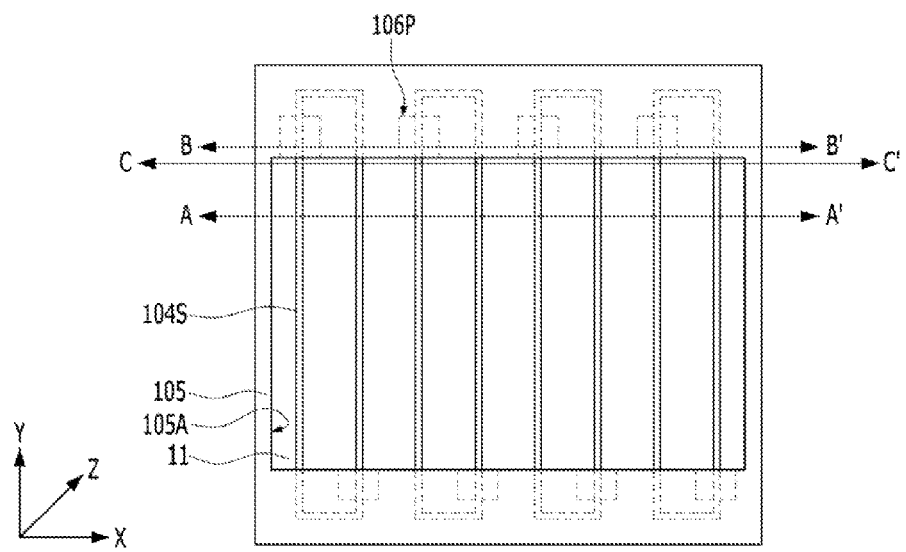
Figure 2H:
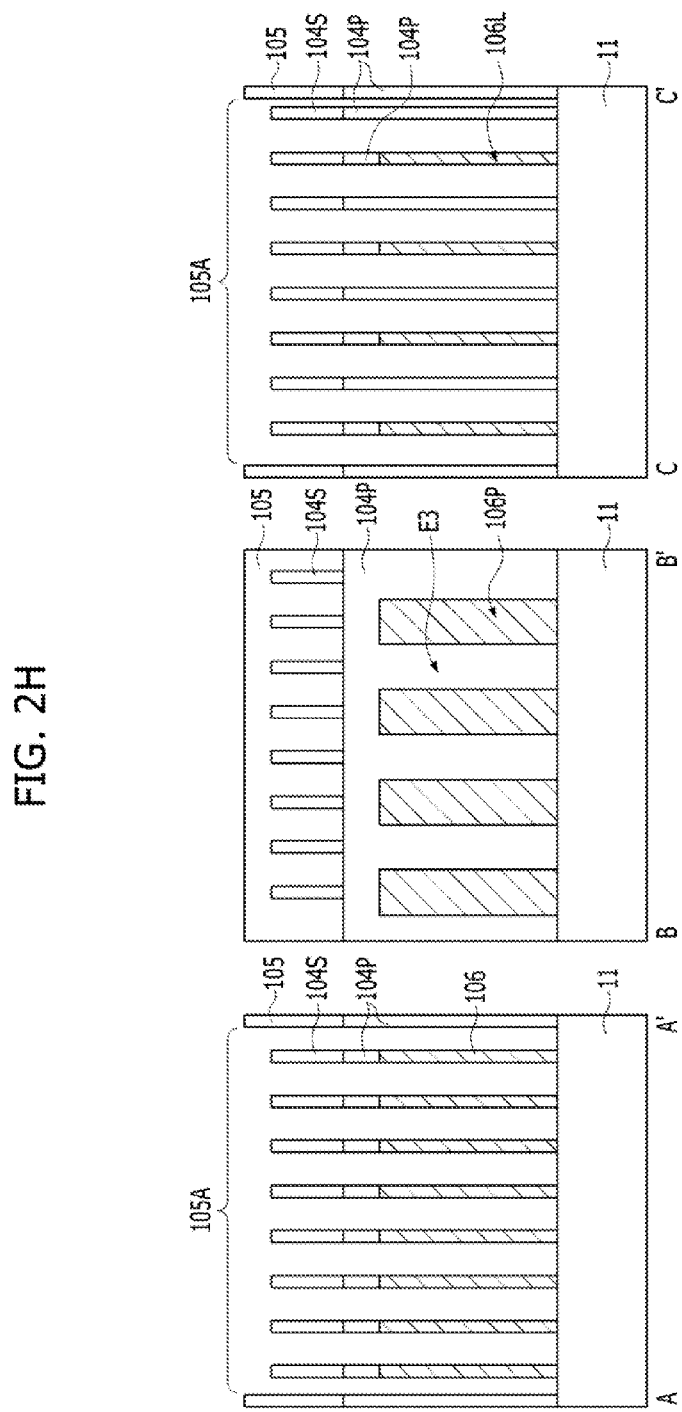

After the bottom layer 104B is etched, as shown in FIGS. 1H and 2H, the pre-pattern 103 may be etched so that a plurality of patterns 106 may be formed. The patterns 106 may include line portions 106L and pad portions 106P. The line portions 106L may have the same line width as the spacers 104S. The pad portions 106P may have the same shapes as the first portions 103A of the pre-pattern 103. The pad portions 106P may be connected to the ends of the line portions 106L. The line portions 106L and the pad portions 106P may be formed concurrently. Namely, the line portions 106L and the pad portions 106P may be formed concurrently by a single etching using the blocking layer 105 and the spacers 104S. The pad portions 106P have a line width that is larger than the line portions 106L.

Figure 1I:
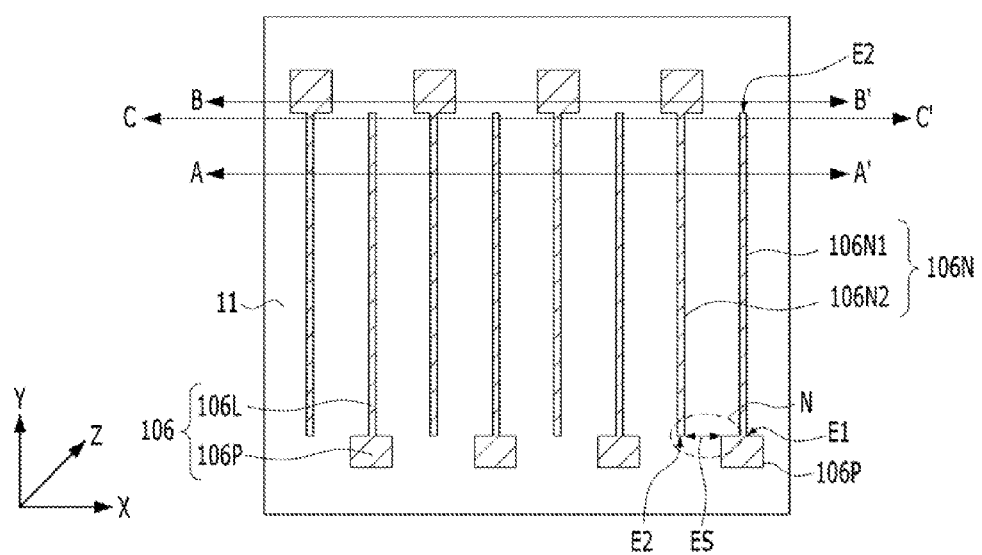
Figure 2I:
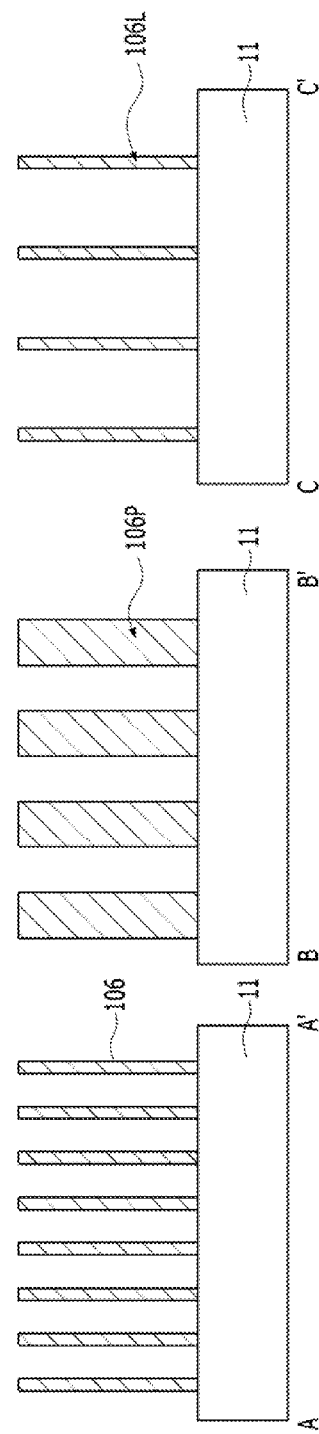

As shown in FIGS. 1I and 2I, the blocking layer 105, the spacers 104S and the patterned bottom layer 104P may then be removed.

By the series of processes described above, the patterns 106 including the line portions 106L and the pad portions 106P may be formed. The pad portions 106P may be formed earlier than the line portions 106L. Therefore, masking and etching processes for forming the line portions 106L and the pad portions 106P may be simplified. The patterns 106 may include bit line structures. Thus, the line portions and the pad portions of the bit line structures may be easily formed.

Each of line portions 106L includes a first end E1 and a second end E2, and only one of the first end E1 and the second end E2 may be connected to a pad portion 106P. For example, when a first end E1 may be connected to the pad portion 106P, the second end E2 may not be connected to the pad portion 106P. In this way, each of the patterns 106 may be asymmetrical structure in which the pad portion 106P is formed at only any one end of the pattern 106. The patterns 106 may be asymmetrical structures in an alternating manner along the X direction. When viewed in the first direction Y, the odd pad portions 106P may not be formed on the same straight lines as the even pad portions 106P. Therefore, the odd pad portions 106P and the even pad portions 106P may be alternately and repetitively formed along the second direction X. That is to say, neighboring pad portions 106P may be arranged in a zigzag style along the second direction X.

The line portions 106L may extend in the first direction Y. Each pair of patterns 106N neighboring in the second direction X may be asymmetrical. Each pair of patterns 106N may be symmetrical in a third direction Z. The third direction Z may be an oblique direction that is oblique with respect to the first direction Y and the second direction X. For example, in the case where the first ends E1 of the line portions 106L and the pad portions 106P are connected, the pad portion 106P of a first neighboring pattern 106N1 may be in contiguity with the second end E2 of a second neighboring pattern 106N2 (see the reference symbol 'N'). The pad portions 106P and the second ends E2 of the patterns 106 neighboring in the second direction X may be alternatively arranged in zigzag arrays. The first ends E1 and the second ends E2 neighboring each other may be positioned on the same straight lines in the second direction X.

Referring again to FIG. 2H, the second ends E2 of the line portions 106L may be covered by ends E3 of the patterned bottom layer 104P. The patterned bottom layer 104P may be formed by etching the bottom layer 104B. The patterned bottom layer 104P may be formed on the patterns 106. The patterned bottom layer 104P may be formed on the line portions 106L and the pad portions 106P. The ends E3 of the patterned bottom layer 104P may cover the sidewalls and the top surfaces of the second ends E2 of the line portions 106L.

Referring again to FIG. 1I, by the ends E3 of the patterned bottom layer 104P, a distance ES between the pad portion 106P of the first neighboring pattern 106N1 and the second end E2 of the second neighboring pattern 106N2 may be secured sufficiently large for substantially reducing any parasitic capacitance formed there between. FIGS. 3A to 3I are plan views of a semiconductor device illustrating a method for forming patterns of the semiconductor device according to a second embodiment of the present invention. FIGS. 4A to 4I are cross-sectional views taken along the lines A-A' and B-B' of FIGS. 3A to 3I.

Figure 3A:
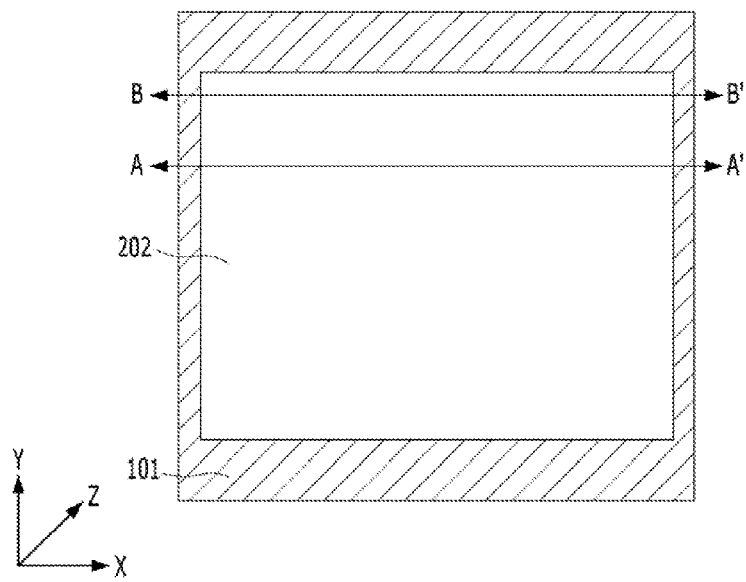
FIGS. 3A to 3I are schematic plan views of a semiconductor device illustrating a method for forming patterns of the semiconductor device, according to a second embodiment of the present invention.
Figure 4A:
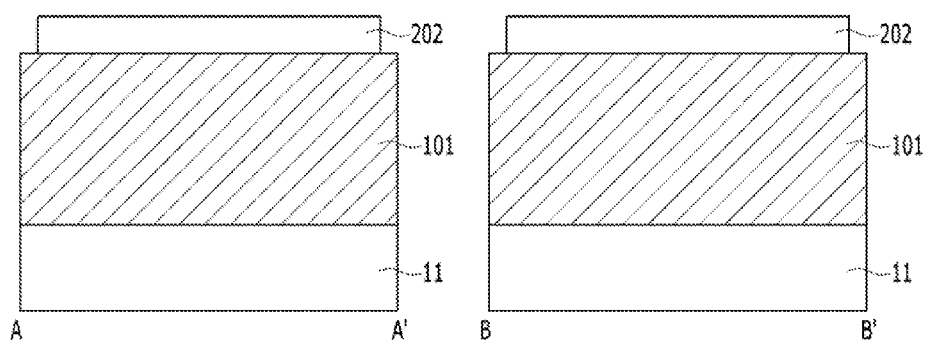
FIGS. 4A to 4I are side, cross-sectional views taken along the lines A-A' and B-B' of FIGS. 3A to 3I.

As shown in FIGS. 3A and 4A, an etch target layer 101 may be formed on a substrate 11. The substrate 11 may be a single layer or a multi-layer. The substrate 11 may be or include a dielectric layer, a conductive layer, a semiconductor layer or a combination thereof. The substrate 11 may include a semiconductor substrate. For example, the substrate 11 may include a silicon substrate, a silicon-germanium substrate, or a Silicon On Insulator (SOI) substrate. The substrate 11 may include a shallow trench isolation (STI) region. For example, the substrate 11 may include a silicon substrate in which a shallow trench isolation (STI) region is formed.

The etch target layer 101 may be a single layer or a multi-layer. The etch target layer 101 may include a dielectric layer, a conductive layer, a semiconductor layer or a combination thereof. The etch target layer 101 may be or include a metal layer. The etch target layer 101 may be a stack of a metal layer and a dielectric layer. In another embodiment, the etch target layer 101 may be a material suitable for forming bit line structures. For example, the etch target layer 101 may be a multilayer including a barrier layer, a bit line layer and a hard mask layer sequentially stacked in this order. The barrier layer may include tungsten nitride (WN), titanium nitride (TiN), tungsten silicon nitride (WSiN) or a combination thereof. The bit line layer may be or include a metal layer. The bit line layer may be or include a tungsten layer. The hard mask layer may be or include a nitride, an oxide, a carbon, an ARC, a polysilicon, an SOC or a combination thereof.

An etch mask layer 202 may be formed on the etch target layer 101. The etch mask layer 202 may include a photoresist. In another embodiment, the etch mask layer 202 may be a material which has an etching selectivity with respect to the etch target layer 101. The etch mask layer 202 may be or include a nitride, an oxide, a carbon, an ARC, a polysilicon, an SOC or a combination thereof. The etch mask layer 202 may be a multi-layer which is made up of different materials. The etch mask layer 202 may cover most of the etch target layer 101. The etch mask layer 202 may be different from the etch mask layer 102 (see FIG. 1A)

according to the first embodiment. The etch mask layer 202 may be patterned to have a plate shape. For example, the etch mask layer 202 may not include the plurality of first portions 102A and the plurality of second portions 102B shown in FIG. 1A. Therefore, the non-exposed portion of the etch target layer 101 may include regions where pad portions are to be formed and regions where line portions are to be formed. In this way, pad portions may not be defined in advance in the etch mask layer 202 of the second embodiment.

Figure 3B:
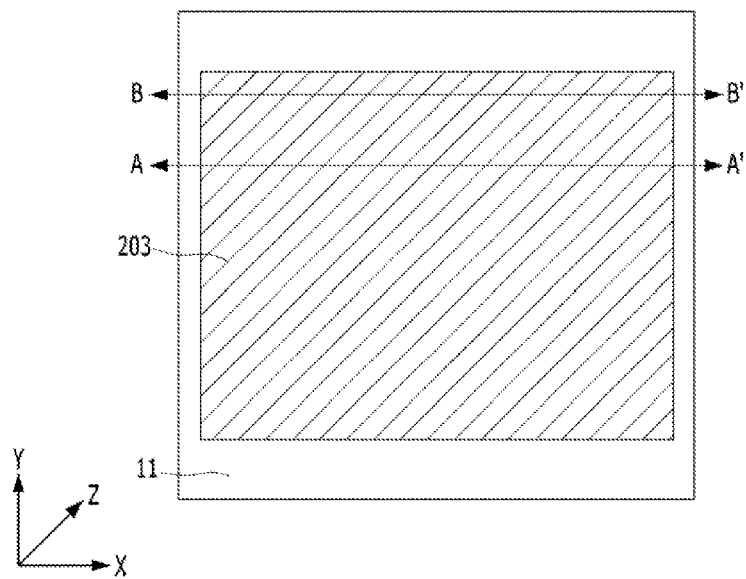
Figure 4B:
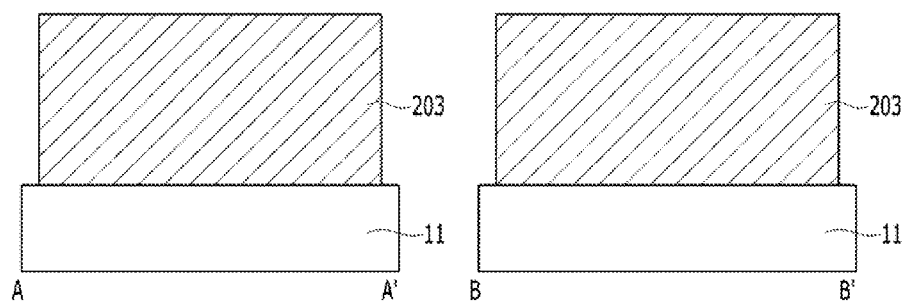

As shown in FIGS. 3B and 4B, a pre-pattern 203 of a plate shape may be formed. In order to form the pre-pattern 203, the etch target layer 101 may be etched using the etch mask layer 202. Unlike the pre-pattern 103 of the first embodiment, the pre-pattern 203 may not include the first portions 103A and the second portions 103B.

Portions of the substrate 11 may be exposed by the pre-pattern 203.

Next, the etch mask layer 202 may be removed by strip process.

As described above, the pre-pattern 203 may be formed by single masking and etching process.

Figure 3C:
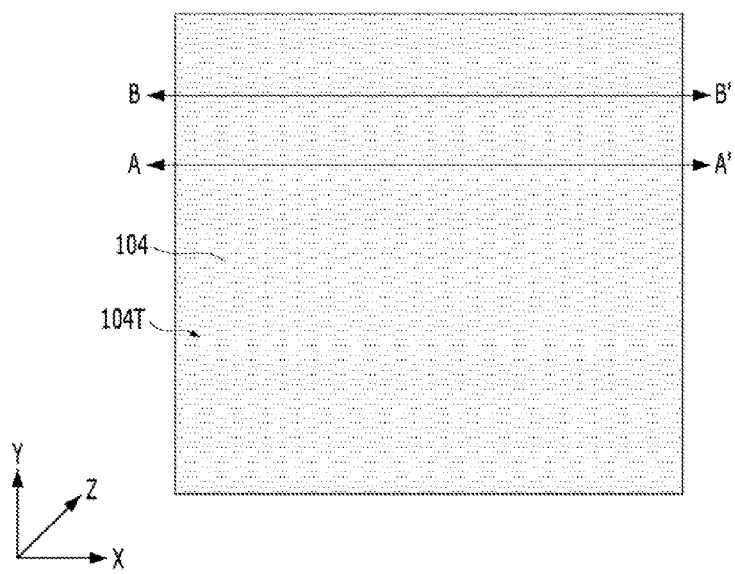
Figure 4C:
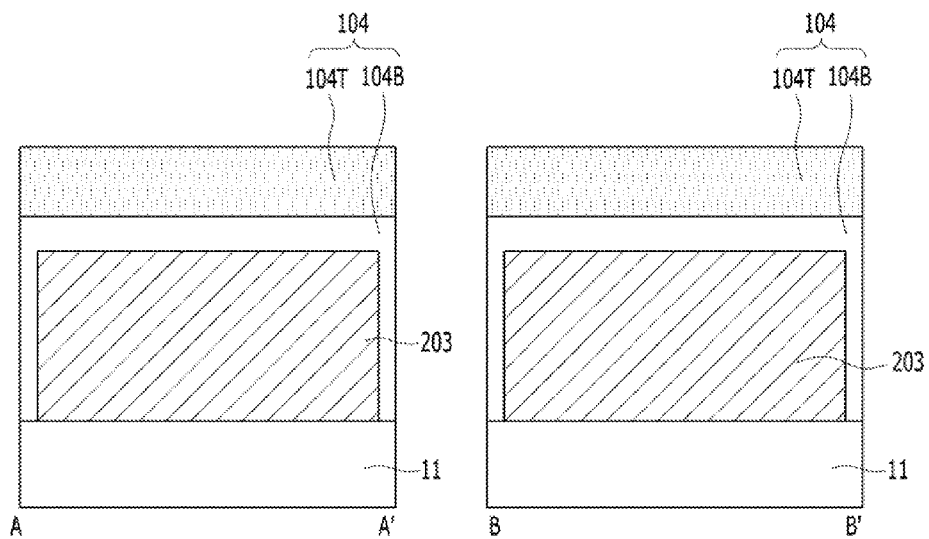

As shown in FIGS. 3C and 4C, a hard mask layer 104 may be formed on the pre-pattern 203. The hard mask layer 104 may be a material which has an etching selectivity with respect to the pre-pattern 203. The hard mask layer 104 may include a nitride, an oxide, a carbon, an ARC, a polysilicon, an SOC or a combination thereof. The hard mask layer 104 may be a multi-layer which is made up of different materials. The hard mask layer 104 may include a bottom layer 104B and a top layer 104T. The bottom layer 104B may be filled on the portions of the substrate 11 exposed by the pre-pattern 203 to cover the pre-pattern 203. The top layer 104T may be formed on the bottom layer 104B. The bottom layer 104B and the top layer 104T may be different materials. The top layer 104T may be a material which has an etching selectivity with respect to the bottom layer 104B.

Subsequently, as shown in FIGS. 3D, 3E, 4D and 4E, an SPT (spacer patterning technology) process may be performed.

Figure 3D:
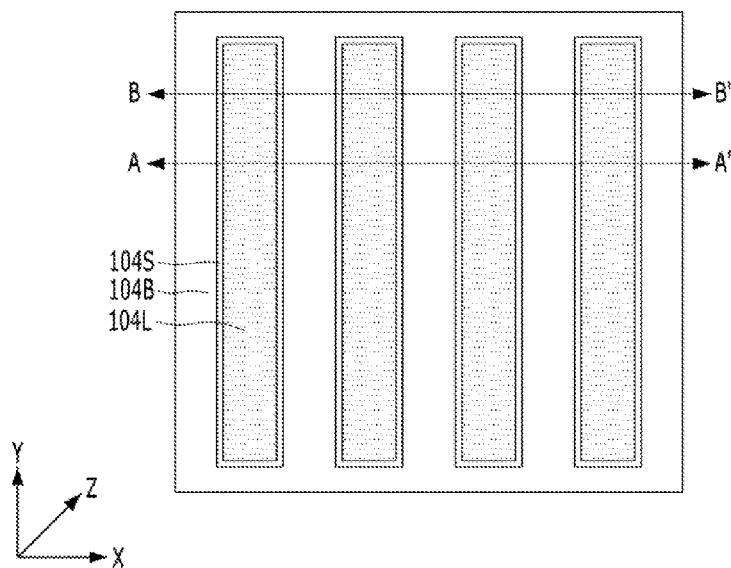
Figure 4D:
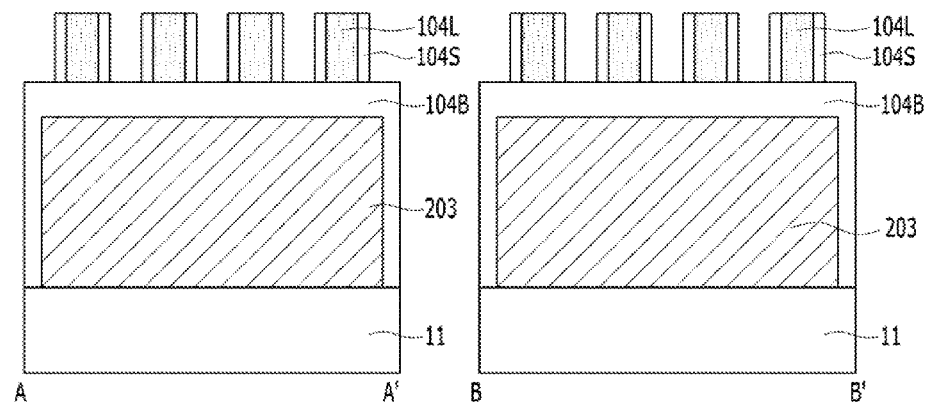

As shown in FIGS. 3D and 4D, a plurality of sacrificial patterns 104L may be formed. The plurality of sacrificial patterns 104L may be formed by etching the top layer 104T of the hard mask layer 104. The plurality of sacrificial patterns 104L may be line shapes. Portions of the bottom layer 104B may be exposed between the sacrificial patterns 104L. The sacrificial patterns 104L may extend in a first direction Y.

Next, a plurality of spacers 104S may be formed. The spacers 104S may be formed on the sidewalls of the sacrificial patterns 104L. The spacers 104S may include a material which has an etching selectivity with respect to the bottom layer 104B and the sacrificial patterns 104L. For example, for forming the spacers 104S, an oxide layer is formed on the sacrificial patterns 104L and the bottom layer 104B. Then, the oxide layer may be etched back so that the spacers 104S may be formed on both sidewalls of the sacrificial patterns 104L. The spacers 104S may be shapes which extend across the pre-pattern 203.

Figure 3E:
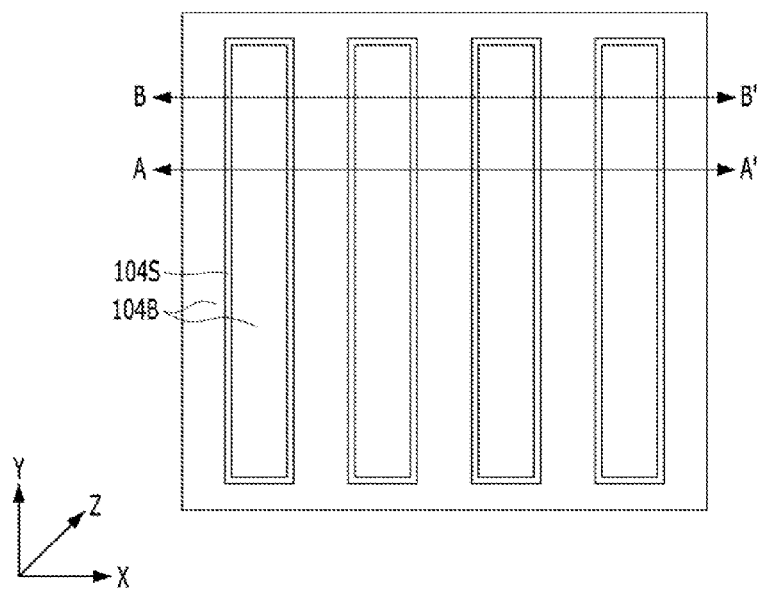
Figure 4E:
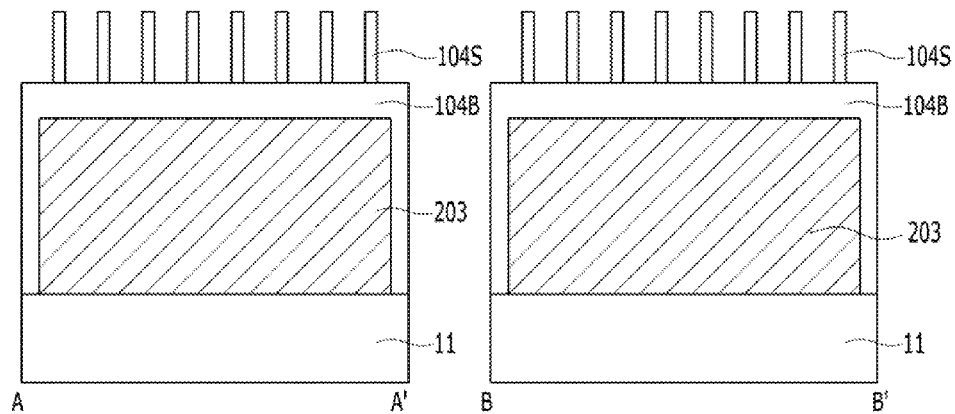

As shown in FIGS. 3E and 4E, the sacrificial patterns 104L may be removed so that the insides of the spacers 104S may be opened. Only the spacers 104S may remain on the bottom layer 104B. The spacers 104S may be closed-loop shapes.

Figure 3F:
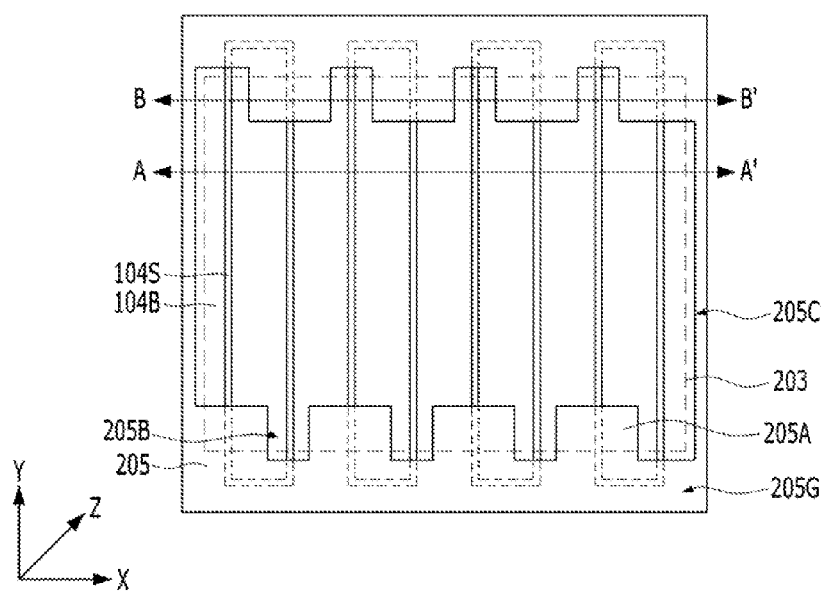
Figure 4F:
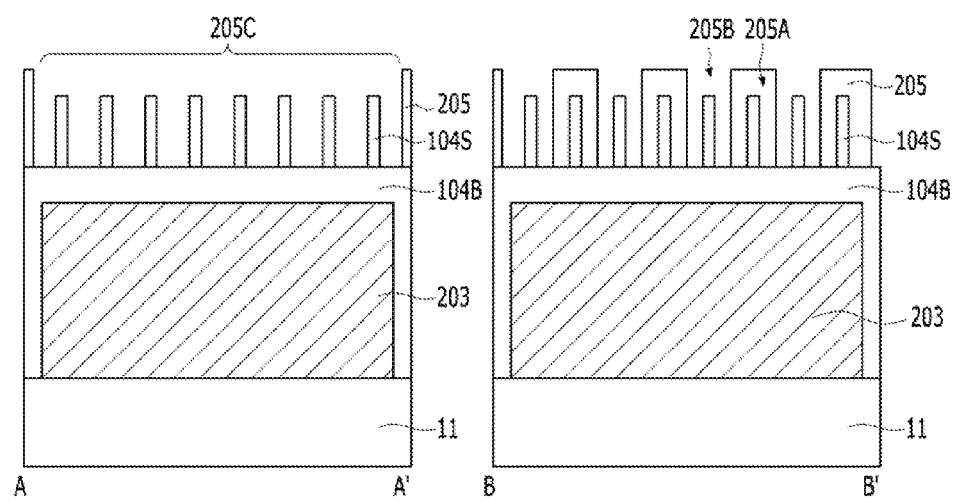

As shown in FIGS. 3F and 4F, a blocking layer 205 may be formed. The blocking layer 205 may be different from the blocking layer 105 (see FIG. 1F) according to the first embodiment. The blocking layer 205 may include a plurality of first portions 205A and a plurality of second portions 205B. Because of the spacings between neighboring first portions 205A provided by the second portions 205B, portions of the bottom layer 104B may be exposed. All of the first portions 205A of the blocking layer 205 may have the same size. All of the second portions 205B of the blocking layer 205 may have the same size. The first portions 205A and the second portions 205B of the blocking layer 205 may be alternately and repetitively formed along the X direction. The first portions 205A and the second portions 205B of the blocking layer 205 may be successive to each other. The first portions 205A and the second portions 205B of the blocking layer 205 may have quadrangular shapes which extend in opposite directions, when viewed from the top. For example, the first portions 205A may be convex, and the second portions 205B may be concave. The blocking layer 205 may further include a third portion 205C. The third portion 205C may have a rectangular flat when viewed form the top and may be larger in area than the first portions 205A and the second portions 205B. Most of the bottom layer 104B may be exposed by the third portion 205C. The second portions 205B and the third portion 205C of the blocking layer 205 may expose most of the bottom layer 104B. For example, the second portions 205B and the third portion 205C may serve as an opening.

Hence, because of the second portions 205B and the third portion 205C of the blocking layer 205, portions of the spacers 104S and the bottom layer 104B may be exposed. The first portions 205A of the blocking layer 205 may overlap with portions of the spacers 104S. The second portions 205B of the blocking layer 205 may overlap with portions of the spacers 104S. The first portions 205A of the blocking layer 205 may be referred to as pad-like portions. The first portions 205A may protrude from a base portion 205G having a shape surrounding the edges of the pre-pattern 203. The first portions 205A may protrude from the base portion 205G in the first direction Y. When viewed in the first direction Y, the first portions 205A may protrude from the opposing sidewalls of the base portion 205G. The first portions 205A protruded from one sidewall of the base portion 205G may not be formed on the same straight lines as the first portions 205A protruded from the other sidewall of the base portion 205G. Accordingly, the first portions 205A protruded from one sidewall of the base portion 205G and the first portions 205A protruded from the other sidewall of the base portion 205G may be alternately and repetitively formed along a second direction X. That is to say, the first portions 205A may be arranged in a zigzag style along the second direction X. In another embodiment, when viewed in the second direction X, the third portion 205C of the blocking layer 205 may be aligned with the edges of the pre-pattern 203. In another embodiment, when viewed in the first direction Y, the second portions 205B of the blocking layer 205 may be aligned with the edges of the pre-pattern 203.

Figure 3G:
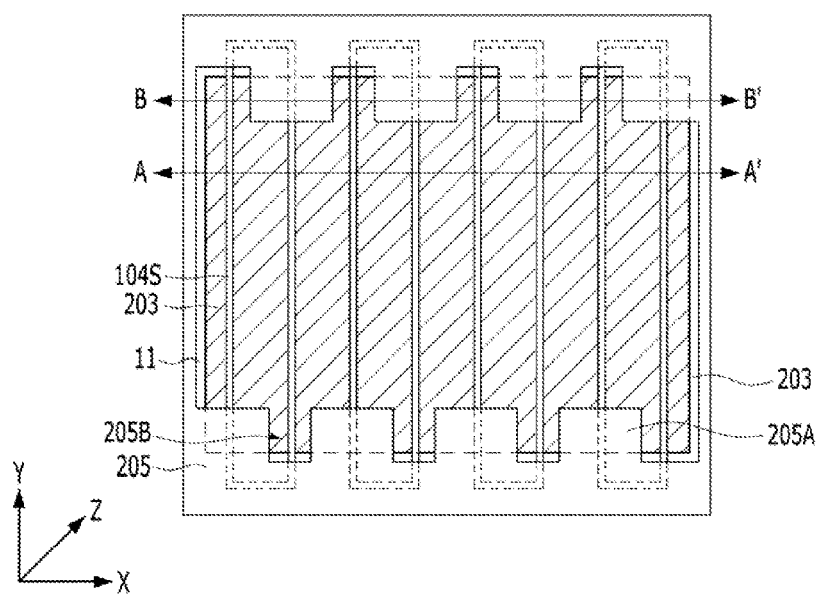
Figure 4G:
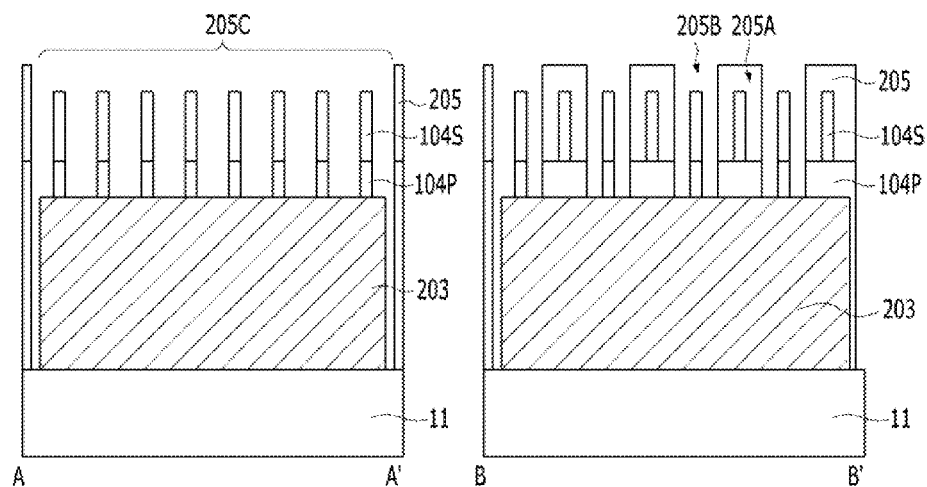

As shown in FIGS. 3G and 4G, the bottom layer 104B may be etched using the blocking layer 205 and the spacers 104S. After the bottom layer 104B is etched, portions of the pre-pattern 203 and portions of the substrate 11 may be exposed. A patterned bottom layer 104P may be formed by etching the bottom layer 104B.

Figure 3H:
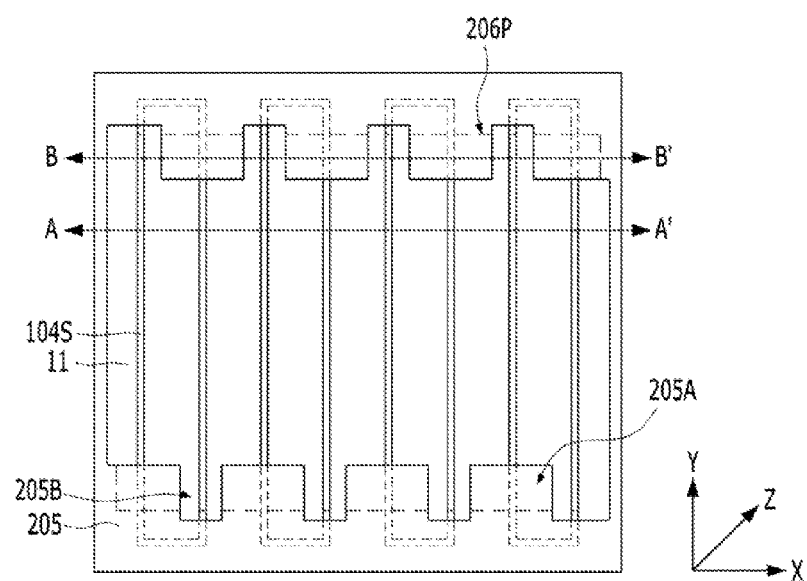
Figure 4H:
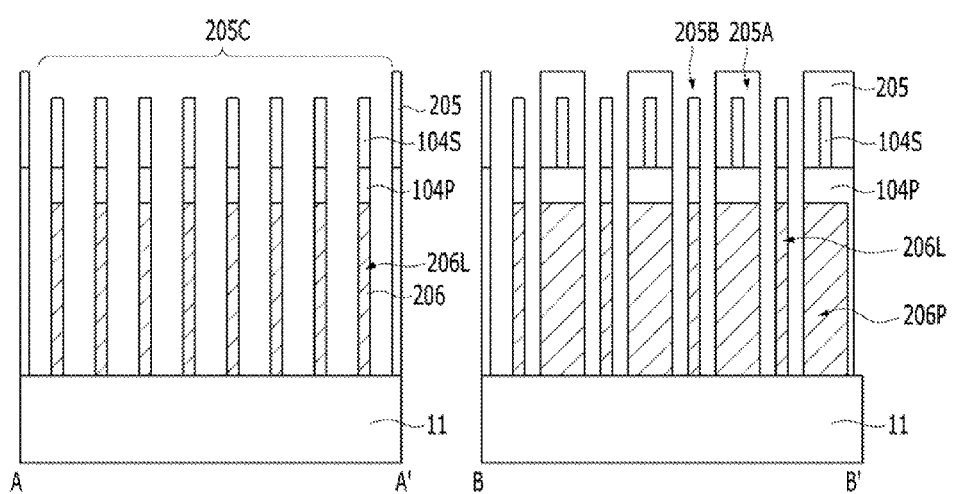

After the bottom layer 104B is etched, as shown in FIGS. 3H and 4H, the pre-pattern 203 may be etched such that a plurality of patterns 206 may be formed. The patterns 206 may include line portions 206L and pad portions 206P. The line portions 206L may have the same line width as the spacers 104S. The pad portions 206P may have the same shapes as the first portions 205A of the blocking layer 205. The pad portions 206P may be connected to the ends of the line portions 206L. The line portions 206L and the pad portions 206P may be formed concurrently. For example, the line portions 206L and the pad portions 206P may be formed concurrently by a single etching using the blocking layer 205 and the spacers 104S. The pad portions 206P may have a line width larger than the line portions 206L. The patterned bottom layer 104P may be formed on the patterns 206. The patterned bottom layer 104P may be formed on the line portions 206L and the pad portions 206P.

Figure 3I:
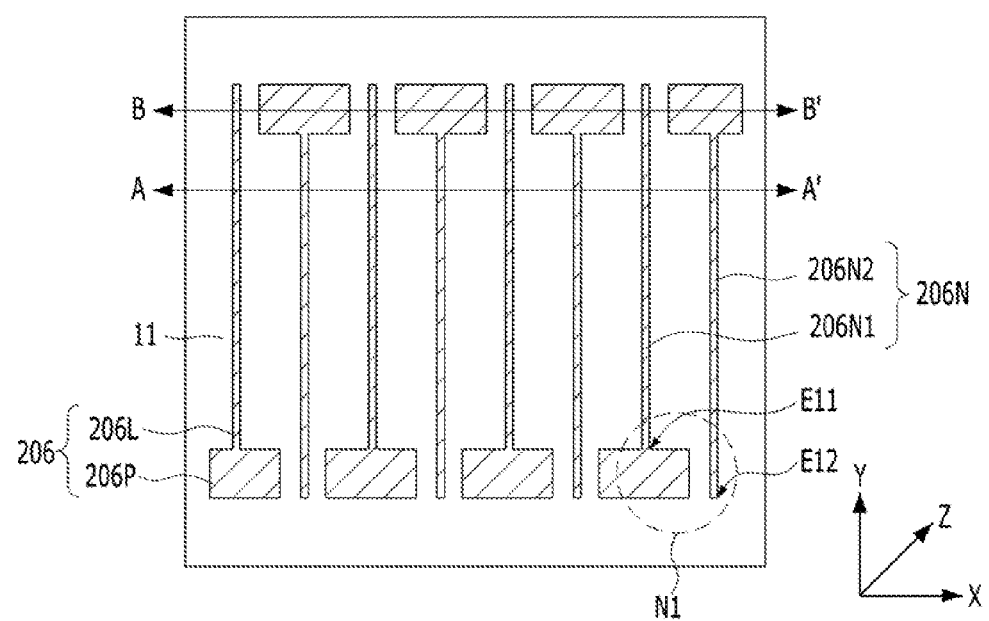
Figure 4I:
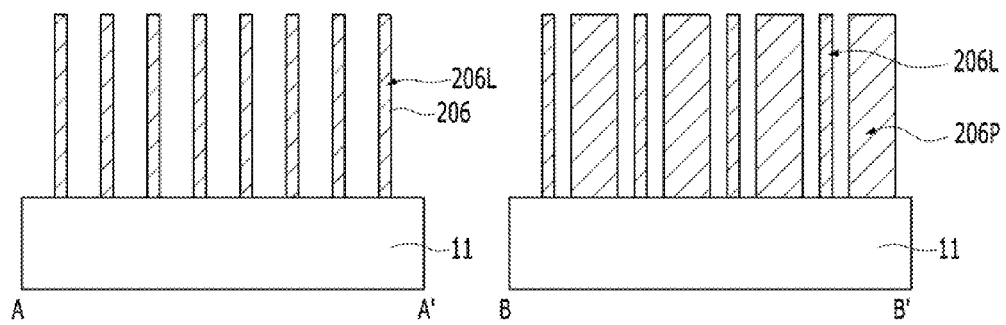

As shown in FIGS. 3I and 4I, the blocking layer 205, the spacers 104S and the patterned bottom layer 104P may be removed.

By the series of processes described above, the patterns 206 including the line portions 206L and the pad portions 206P may be formed. The line portions 206L and the pad portions 206P may be formed concurrently. Therefore, masking and etching process for forming the line portions 206L and the pad portions 206P may be simplified. The patterns 206 may include bit line structures. Thus, the line portions and the pad portions of the bit line structures may be formed concurrently.

Each of the line portions 206L includes a first end E11 and a second end E12, and only one of the first end E11 and the second end E12 may be connected to a pad portion 206P. For example, when the first end E11 may be connected to the pad portion 206P, the second end E12 of the same line portion 206L may not be connected to the pad portion 206P. In this way, each of the patterns 206 may be asymmetrical structure in which the pad portion 206P is formed at only one end of the patterns 206.

The line portions 206L may extend in the first direction Y. Each pair of patterns 206N neighboring in the second direction X may be asymmetrical. Each pair of patterns 206N may be symmetrical in a third direction Z. The third direction Z may be an oblique direction that is oblique with respect to the first direction Y and the second direction X. For example, in the case where the first ends E11 of the line portions 206L and the pad portions 206P are connected, the pad portion 206P of a first neighboring pattern 206N1 may be in contiguity with the second end E12 of a second neighboring pattern 206N2 (see the reference symbol 'N1').

Figure 5A:
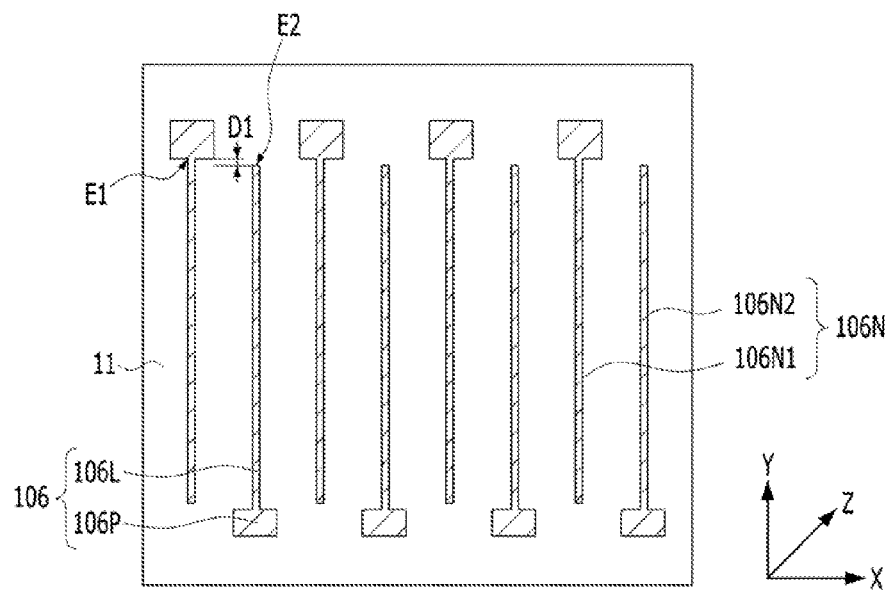
FIGS. 5A and 5B are schematic plan views illustrating modified examples of pad portions, according to the first embodiment of the present invention.
Figure 5B:
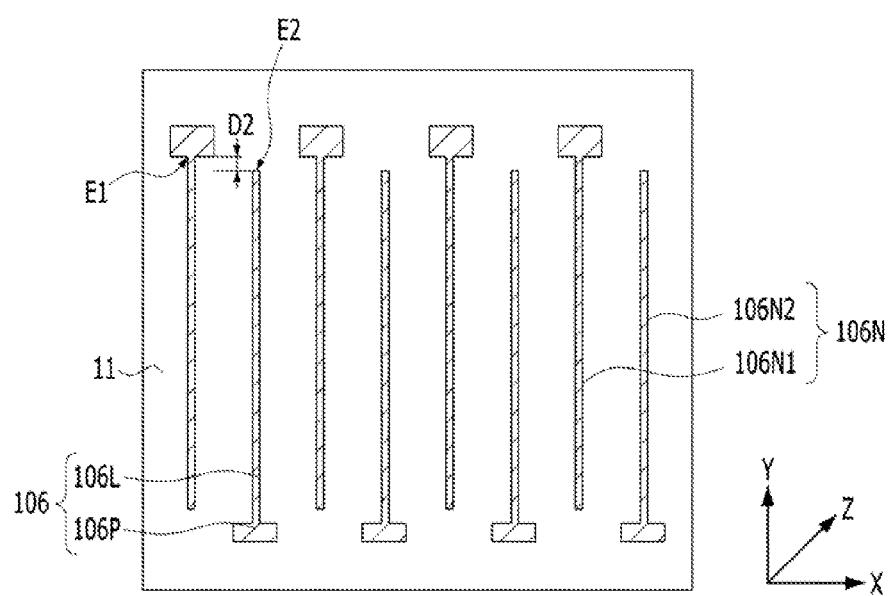

FIGS. 5A and 5B are plan views illustrating representations of modified examples of pad portions according to the first embodiment of the present invention.

Referring to FIGS. 5A and 5B, the size of the pad portions 106P in the first direction Y may be modified variously. The sizing of the pad portions 106P may be realized by modifying the blocking layer 105. For example, by varying the position of the opening 105A of the blocking layer 105 in FIG. 1G, the size of the pad portions 106P may be modified variously. The first ends E1 and the second ends E2 neighboring each other may not be positioned on the same straight lines.

In this way, by lengthening the intervals D1 and D2 between the pad portion 106P and the neighboring second end E2, bridging between neighboring patterns 106 may be prevented.

Even in the second embodiment, by varying the positions of the first portions 205A of the blocking layer 205, the size of the pad portions 206P may be modified variously.

Figure 6:
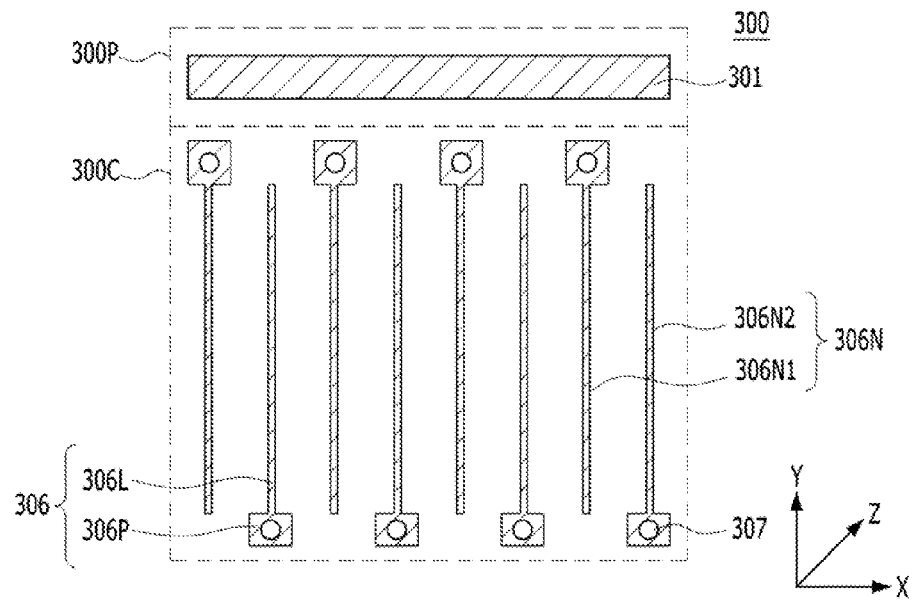
FIG. 6 is a schematic plan view illustrating an application example of the first embodiment of the present invention.

FIG. 6 is a plan view illustrating an application example of the first embodiment of the present invention.

More specifically, FIG. 6 shows a memory device having a plurality of bit line structures formed by using the first embodiment of the present invention.

Referring to FIG. 6, a memory device 300 may include a cell region 300C and a peripheral circuit region 300P. A plurality of bit line structures 306 may be formed in the cell region 300C. A gate structure 301 may be formed in the peripheral circuit region 300P. The plurality of bit line structures 306 may have higher density patterns. The gate structure 301 may have a lower density pattern.

The bit line structures 306 may include bit line portions 306L and bit line pad portions 306P. The bit line pad portions 306P may be formed earlier than the bit line portions 306L. For a method for forming the bit line portions 306L and the bit line pad portions 306P, reference may be made to the above-described first embodiment. The bit line portions 306L may extend in a first direction Y. Each pair of bit lines 306N neighboring in a second direction X may be asymmetrical. Each pair of bit lines 306N may be symmetrical in a third direction Z.

Contact plugs 307 may be connected to the bit line pad portions 306P of the bit line structures 306.

The bit line structures 306 and the gate structure 301 may be formed separately. In another embodiment, the bit line structures 306 and the gate structure 301 may be formed concurrently.

Figure 7A:
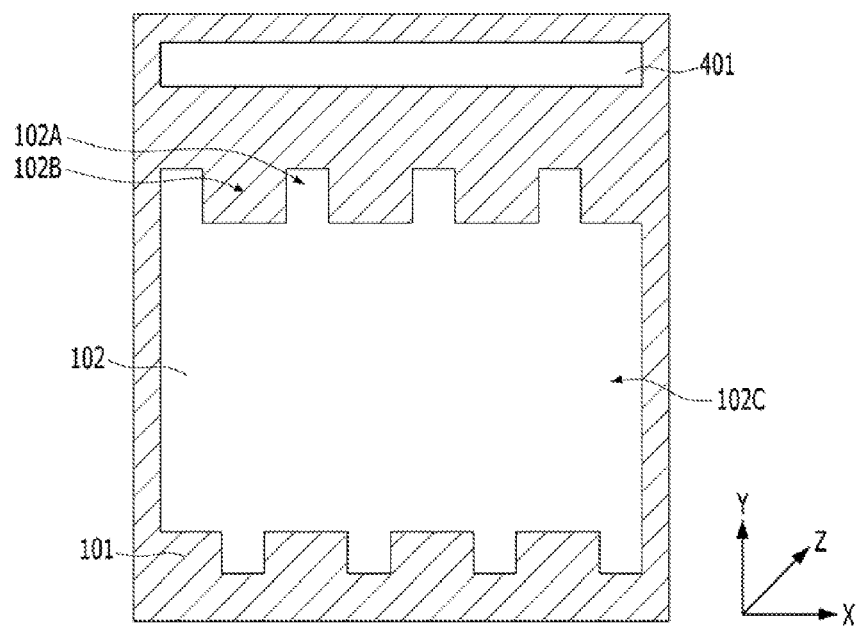
FIGS. 7A and 7B are schematic plan views illustrating a method for forming a gate structure, according to an application example of the first embodiment of the present invention.
Figure 7B:
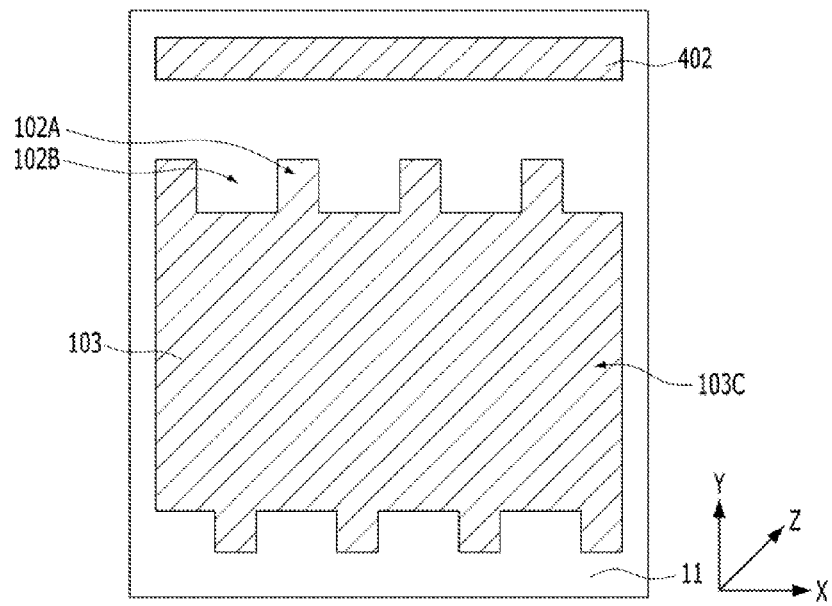

FIGS. 7A and 7B are plan views illustrating a method for forming a gate structure, according to an application example of the first embodiment of the present invention.

Referring to FIGS. 1A and 7A, an etch mask layer 102 may be formed in a cell region. A gate mask layer 401 may be formed in a peripheral circuit region. The etch mask layer 102 and the gate mask layer 401 may be formed concurrently. For example, the etch mask layer 102 and the gate mask layer 401 may be formed concurrently by performing a single photolithography process.

Referring to FIGS. 1B and 7B, an etch target layer 101 may be etched using the etch mask layer 102 and the gate mask layer 401 so that a gate structure 402 may be formed in the peripheral circuit region. A pre-pattern 103 may be formed in the cell region. For example, the gate structure 402 may be formed by etching a portion of the etch target layer 101, and the pre-pattern 103 may be formed by etching the remaining portion of the etch target layer 101.

In this way, the gate structure 402 may be formed in the peripheral circuit region, and the pre-pattern 103 may be formed in the cell region. In addition, at the same time of forming the gate structure 402, the pre-pattern 103 of a plate shape may be formed. For example, when forming the gate structure 402, bit line structures are not patterned concurrently. For a method for forming the bit line structures, for example, the patterns 106, reference may be made to FIGS. 1C to 1I and FIGS. 2C to 2I. In the present embodiment, the gate structure 402 and the bit line structures 306 may be separately formed.

Referring again to FIG. 6, the contact plugs 307 may be connected to the pad portions 306P of the bit line structures 306. For forming the contact plugs 307, a contact etching is performed. When performing the contact etching, punching may be prevented by the pad portions 306P. Moreover, when performing the contact etching, an overlap margin may be secured by the pad portions 306P.

Figure 8:
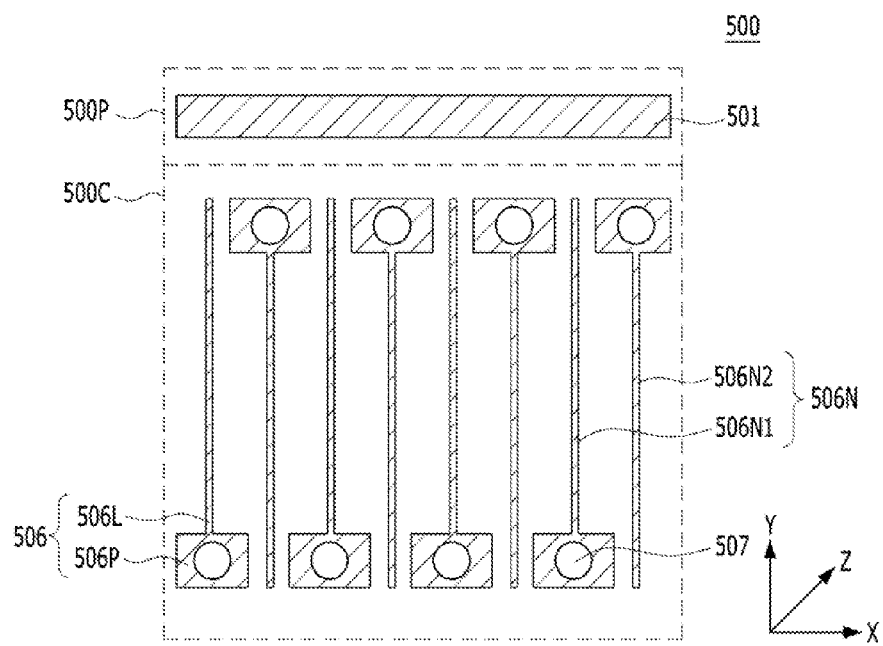
FIG. 8 is a schematic plan view illustrating an application example of the second embodiment of the present invention.

FIG. 8 is a plan view of a memory device having a plurality of bit line structures formed using a method according to the second embodiment of the present invention.

Referring to FIG. 8, a memory device 500 may include a cell region 500C and a peripheral circuit region 500P. A plurality of bit line structures 506 may be formed in the cell region 500C. A gate structure 501 may be formed in the peripheral circuit region 500P.

The bit line structures 506 may include bit line portions 506L and bit line pad portions 506P. The bit line portions 506L and the bit line pad portions 506P may be formed concurrently. For a method for forming the bit line portions 506L and the bit line pad portions 506P, reference may be made to the above-described second embodiment. The bit line portions 506L may extend in a first direction Y. Each pair of bit lines 506N neighboring in a second direction X may be asymmetrical. Each pair of bit lines 506N may be symmetrical in a third direction Z.

Contact plugs 507 may be connected to the bit line pad portions 506P of the bit line structures 506.

The bit line structures 506 and the gate structure 501 may be formed separately. In another embodiment, the bit line structures 506 and the gate structure 501 may be formed concurrently.

Figure 9A:
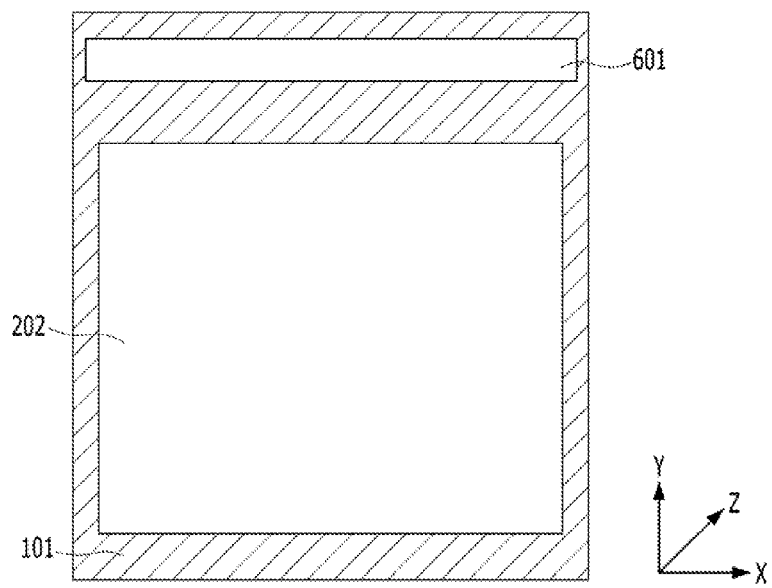
FIGS. 9A and 9B are schematic plan views illustrating a method for forming a gate structure according to an application example of the second embodiment of the present invention.
Figure 9B:
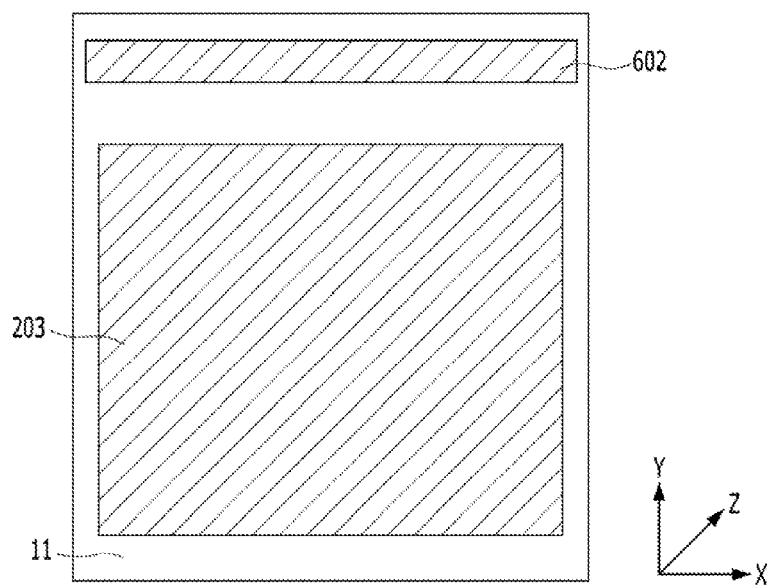

FIGS. 9A and 9B are representations of examples of plan views illustrating a method for forming a gate structure using a method according to the second embodiment of the present invention.

Referring to FIGS. 3A and 9A, an etch mask layer 202 may be formed in a cell region. A gate mask layer 601 may be formed in a peripheral circuit region. The etch mask layer 202 and the gate mask layer 601 may be formed concurrently.

Referring to FIGS. 3B and 9B, an etch target layer 101 may be etched using the etch mask layer 202 and the gate mask layer 601 so that a gate structure 602 may be formed in the peripheral circuit region. A pre-pattern 203 may be formed in the cell region.

In this way, the gate structure 602 may be formed in the peripheral circuit region, and the pre-pattern 203 may be formed in the cell region. In addition, at the same time of forming the gate structure 602, the pre-pattern 203 of a plate shape may be formed. For example, when forming the gate structure 602, bit line structures are not patterned concurrently. For a method for forming the bit line structures, for example, the patterns 206, reference may be made to FIGS. 3C to 3I and FIGS. 4C to 4I.

Referring again to FIG. 8, the contact plugs 507 may be connected to the pad portions 506P of the bit line structures 506. In order to form the contact plugs 507, a contact etching is performed. When performing the contact etching, punching may be prevented by the pad portions 506P. Moreover, when performing the contact etching, an overlap margin may be secured by the pad portions 506P.

As is apparent from the above descriptions, in the embodiments, by forming concurrently line portions and pad portions, a process may be simplified.

Also, in the embodiments, since the pad portions are formed, it is possible to secure a punch margin and an overlap margin when etching the contact holes.

Further, in the embodiments, since the line portions are formed after forming in advance the pad portions, it is easy to perform a patterning process.

Moreover, in the embodiments, since the size of the pad portions may be freely adjusted, a bridge margin between neighboring patterns may be increased.

Although various embodiments have been described for illustrative purposes, it will be apparent to those skilled in the art that various changes and modifications may be made without departing from the spirit and scope of the invention as defined in the following claims.

What is claimed is:

1. A method for forming patterns, comprising:
   forming an etch target layer;
   etching the etch target layer to form a pre-pattern of a plate shape;
   forming a plurality of spacers over the pre-pattern;
   forming a blocking layer having a base portion which covers end portions of the spacers, pad-like portions which protrude from the base portion and an opening which exposes the other portions of the spacers and the pre-pattern; and
   etching the pre-pattern by using the blocking layer and the spacers as a barrier, to form a plurality of line portions and a plurality of pad portions,
   wherein the base portion of the blocking layer has a shape surrounding the edges of the pre-pattern.

2. The method according to claim 1, wherein, in the forming of the blocking layer, the pad-like portions protrude from the base portion in a first direction, and are formed to be arranged in a zigzag style in a second direction crossing with the first direction.

3. The method according to claim 1, wherein the pad portions and the line portions are portions of bit lines.

4. The method according to claim 1, wherein the spacers have a line width smaller than the pad-like portions.

5. The method according to claim 1, wherein the forming of the spacers comprises:
   forming a bottom layer over the pre-pattern;
   forming a top layer over the bottom layer;
   etching the top layer to form sacrificial patterns of line shapes over the bottom layer;
   forming the spacers on both sidewalls of the sacrificial patterns; and
   removing the sacrificial patterns.

6. A method for manufacturing a semiconductor device, comprising:
   forming a bit line stack layer over a substrate;
   etching the bit line stack layer to form a pre-bit line pattern of a plate shape;
   forming a hard mask layer including a plurality of spacers, over the pre-bit line pattern;
   forming a blocking layer having a base portion which covers end portions of the spacers, pad-like portions which protrude from the base portion and an opening which exposes the other portions of the spacers and the pre-bit line pattern;
   etching the pre-bit line pattern by using the blocking layer and the spacers as a barrier, to form a plurality of bit line portions and a plurality of bit line pad portions; and
   forming contact plugs which are connected to the bit line pad portions.

7. The method according to claim 6, wherein, in the forming of the blocking layer, the pad-like portions protrude from the base portion in a first direction, and are formed to be arranged in a zigzag style in a second direction crossing with the first direction.

8. The method according to claim 6, wherein the spacers have a line width smaller than the pad-like portions.

9. The method according to claim 6, wherein the forming of the spacers comprises:
   forming a bottom layer over the pre-bit line pattern;
   forming a top layer over the bottom layer;
   etching the top layer to form sacrificial patterns of line shapes over the bottom layer;
   forming the spacers on both sidewalls of the sacrificial patterns; and
   removing the sacrificial patterns.

10. A method for manufacturing a semiconductor device, comprising:

forming a stack layer over a substrate including a cell region and a peripheral circuit region;

etching a portion of the stack layer to form a gate structure in the peripheral circuit region;

etching a remaining portion of the stack layer to form a pre-bit line pattern of a plate shape in the cell region;

forming a hard mask layer including a plurality of spacers, over the pre-bit line pattern;

forming a blocking layer having a base portion which covers end portions of the spacers, pad-like portions which protrude from the base portion and an opening which exposes the other portions of the spacers and the pre-bit line pattern;

etching the pre-bit line pattern by using the blocking layer and the spacers as a barrier, to form a plurality of bit line portions and a plurality of bit line pad portions; and forming contact plugs which are connected to the bit line pad portions.

11. The method according to claim 10, wherein, in the forming of the blocking layer, the pad-like portions protrude from the base portion in a first direction, and are formed to be arranged in a zigzag style in a second direction crossing with the first direction.

12. The method according to claim 10, wherein the spacers have a line width smaller than the pad-like portions.

13. The method according to claim 10, wherein the forming of the spacers comprises:

forming a bottom layer over the pre-bit line pattern;

forming a top layer over the bottom layer;

etching the top layer to form sacrificial patterns of line shapes over the bottom layer;

forming the spacers on both sidewalls of the sacrificial patterns; and removing the sacrificial patterns.

* * * * *